(12) United States Patent
Himori et al.

(10) Patent No.: US 8,393,078 B2
(45) Date of Patent: Mar. 12, 2013

(54) METHOD OF MANUFACTURING CIRCUIT BOARD

(75) Inventors: Tsuyoshi Himori, Osaka (JP); Masaaki Katsumata, Osaka (JP); Toshikazu Kondou, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/446,562

(22) Filed: Apr. 13, 2012

(65) Prior Publication Data

US 2012/0272520 A1 Nov. 1, 2012

(30) Foreign Application Priority Data

Apr. 27, 2011 (JP) ................................. 2011-099172

(51) Int. Cl.
*H01K 3/10* (2006.01)

(52) U.S. Cl. .............. 29/852; 29/830; 29/848; 156/922; 174/262

(58) Field of Classification Search .................... 29/830, 29/831, 846, 848, 851, 852; 156/307.1, 701, 156/922; 174/257, 262; 427/96.2, 97.2
See application file for complete search history.

(56) References Cited

U.S. PATENT DOCUMENTS

| | | | |
|---|---|---|---|
| 5,346,750 A | 9/1994 | Hatakeyama et al. | |
| 5,481,795 A | 1/1996 | Hatakeyama et al. | |
| 6,280,527 B1 | 8/2001 | Sachdev et al. | |
| 6,351,871 B1 | 3/2002 | Sachdev et al. | |
| 6,746,710 B1 | 6/2004 | Lambert | |
| 6,761,790 B2 * | 7/2004 | Kawashima et al. | 427/96.2 |
| 7,181,839 B2 * | 2/2007 | Takenaka et al. | 29/852 |
| 2003/0138553 A1 | 7/2003 | Takenaka et al. | |
| 2003/0318553 | 7/2003 | Takenaka et al. | |

FOREIGN PATENT DOCUMENTS

| | | |
|---|---|---|
| EP | 0568930 A2 | 11/1993 |
| EP | 1278405 A1 | 1/2003 |
| GB | 2352209 A | 1/2001 |
| JP | 06-268345 | 9/1994 |
| JP | 10-290072 | 10/1998 |
| JP | 2002-171060 | 6/2002 |

OTHER PUBLICATIONS

European Search Report issued in European Patent Application No. EP 12165084.0 dated Jul 11, 2012.
Japanese Office Action issued in Japanese Patent Application No. 2011-099172, dated Nov. 8, 2011.

* cited by examiner

*Primary Examiner* — Donghai D. Nguyen
(74) *Attorney, Agent, or Firm* — McDermott Will & Emery LLP

(57) ABSTRACT

In a method of manufacturing a circuit board, a conductive paste is filled in a first hole formed on a first prepreg having both sides to which a first protective film is caused to stick so that a first circuit board is manufactured. A fiber piece housing paste obtained by mixing a fiber piece is recovered to obtain a recovery paste; filtration is carried out through a filter; a solvent or the like is added; and a viscosity, a composition ratio or the like is adjusted so that a reuse paste is fabricated. The reuse paste is filled in a second hole formed on a second prepreg having both sides to which a second protective film is caused to stick.

4 Claims, 17 Drawing Sheets

METHOD OF MANUFACTURING CIRCUIT BOARD

BACKGROUND OF THE INVENTION

1. Field of the Invention

The present invention relates to a method of manufacturing a circuit board for connecting wiring patterns formed on both sides through a via, or a circuit board for connecting layers through a conductive paste.

2. Description of Related Art

In recent years, with a reduction in a size of an electronic component and an increase in a density, a double-sided board or a multilayer board is frequently used as a circuit board to be provided with an electronic component in place of a conventional single-sided board. As a structure of the circuit board, furthermore, an inner via hole structure is proposed in place of a connection of layers by a through hole processing and plating which are conventionally used widely. The inner via hole structure indicates a method of connecting layers by using a conductive paste, and high density wiring can be obtained. A method of manufacturing a circuit board using the conductive paste will be described with reference to FIGS. 14A to 15C. FIGS. 14A to 14D are sectional views for explaining the method of manufacturing a circuit board by using the conductive paste.

FIG. 14A shows a section of prepreg 1 having protective film 2 provided on both sides. FIG. 14B shows a state in which hole 3 is provided on prepreg 1 illustrated in FIG. 14A. FIG. 14C shows a state in which prepreg 1 having hole 3 formed thereon is fixed to base 6 and jig 4 of a squeegee formed by rubber (or a rub-in rubber plate) is moved in a direction of arrow 7 to fill hole 3 with conductive paste 5. FIG. 14D shows a state in which protective film 2 is peeled from both sides of prepreg 1 and protruded portion 8 formed by conductive paste 5 is provided.

FIGS. 15A to 15C are sectional views for explaining a method of manufacturing a both-sided board using a conductive paste, illustrating subsequent steps to FIG. 14D.

FIG. 15A shows a state in which copper foil 9 is disposed on both sides of prepreg 1 provided with protruded portion 8, and pressurization and integration are carried out as shown in arrow 71 by using a press device (not shown). In the integration, heating is also useful. By providing protruded portion 8 on conductive paste 5, it is possible to compress and bond conductive powder particles contained in conductive paste 5 at a high density.

FIG. 15B is a sectional view showing a state brought after copper foil 9 is integrated through prepreg 1 or conductive paste 5. In FIG. 15B, insulating layer 10 is formed by heating and curing prepreg 1. In via 11, the conductive powder particles contained in conductive paste 5 are compressed, deformed, and bonded to each other.

FIG. 15C shows a state in which copper foil 9 of FIG. 15B is subjected to etching to form wiring 12 having a predetermined pattern. Then, a solder resist or the like (which is not shown) is formed so that a double-sided board is manufactured.

For the prior art document related to the invention of the application, there are known Unexamined Japanese Patent Publication Nos. H06-268345 and 2002-171060.

SUMMARY OF THE INVENTION

A method of manufacturing a circuit board according to the present invention has a first sticking step, a first hole step, a first applying step, a filling step, a recovering step, a filtering step, a adjusting step, a second sticking step, a second hole step, a second applying step, and a filling step.

At the first sticking step, a first protective film is caused to stick to a surface of a first prepreg. At the first hole step, a first hole is formed on the first prepreg through the first protective film. At the first applying step, a conductive paste is applied onto the first protective film. At the filling step, a part of the conductive paste is filled in the first hole. At the recovering step, a plurality of conductive pastes which is not filled in the first hole is collected and recovered as a recovery paste. At the filtering step, the recovery paste in a paste state is filtered as it is and a foreign substance containing a fiber piece taken away from the prepreg is removed to obtain a filtered recovery paste. At the adjusting step, at least one of a solvent, a resin and a paste having a different composition from the filtered recovery paste is added to and mixed with the filtered recovery paste, and a viscosity, a solid content or the like is adjusted to obtain a reuse paste. At the second sticking step, a second protective film is caused to stick to a surface of a second prepreg. At the second hole step, a second hole is formed on the second prepreg through the second protective film. At the second applying step, a reuse paste is applied onto the second protective film. At the filling step, a part of the reuse paste is filled in the second hole.

DETAILED DESCRIPTION OF THE PREFERRED EMBODIMENT

FIGS. 1A to 1C, FIG. 2A and FIG. 2B are sectional views for explaining a state in which a fiber piece constituted by a part of a glass fiber or a resin fiber and sticking onto a protective film is recovered into a conductive paste.

Figure 1A:
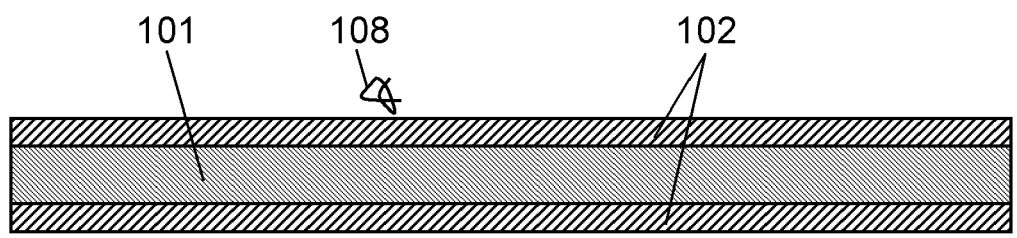
FIGS. 1A to 1C are sectional views for explaining a state in which a fiber piece sticking onto a first protective film is recovered into a conductive paste.
Figure 1B:
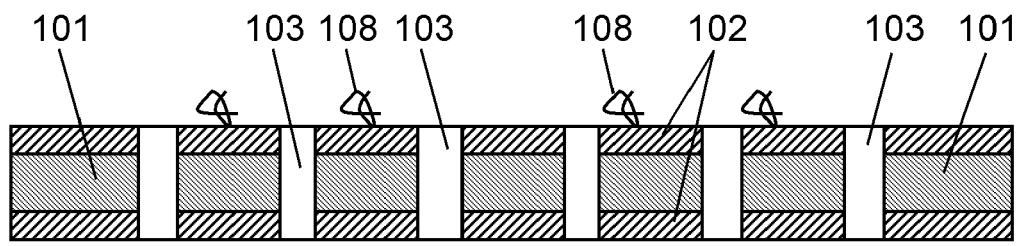
Figure 1C:
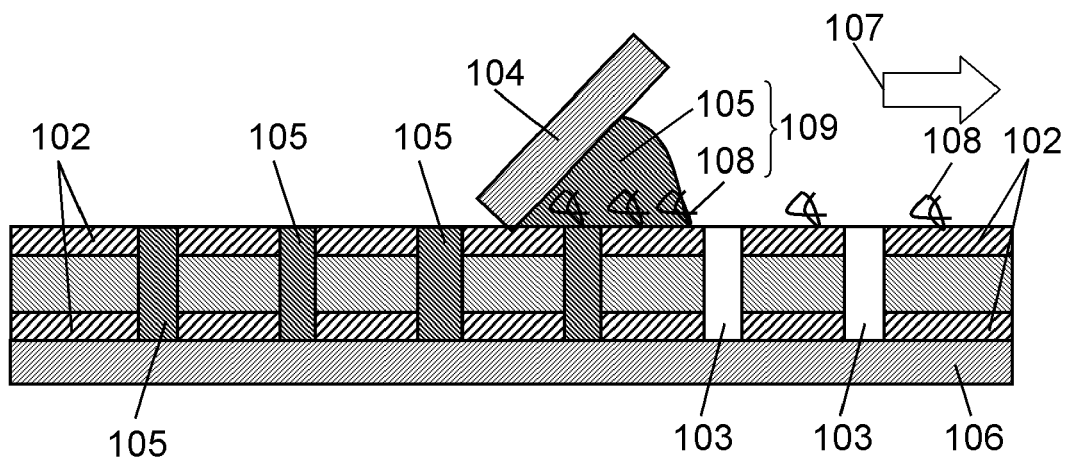

FIGS. 1A to 1C are sectional views for explaining a state in which a fiber piece constituted by a glass fiber or a resin fiber such as aramid and sticking onto a first protective film is recovered into a conductive paste. First prepreg 101 is formed in a semi-curing state (that is, a B stage state) by impregnating a glass woven fabric, a glass non-woven fabric, an aramid fabric or an aramid non-woven fabric with an epoxy resin or the like. First protective film 102 is a PET film or the like. First hole 103 is formed by a carbon dioxide laser device or the like. Jig 104 is a squeegee rubber or the like. Conductive paste 105 contains conductive powder such as copper powder, and a thermosetting resin such as an epoxy resin. Fiber piece 108 is a foreign substance which drops out of a cut surface of first prepreg 101, has an epoxy resin in a semi-curing state or the like sticking thereto and is formed of a glass fiber or a fiber such as aramid, and may be a fiber piece group to which a plurality of fiber pieces is bound thereto through a resin.

In FIG. 1A, first protective film 102 is applied to both sides of first prepreg 101. Fiber piece 108 sticks to a surface of first protective film 102. In the case in which a plurality of first prepregs 101 is stacked in a thickness direction, they stick to the surface of prepreg 101 with static electricity or the like. Even if fiber piece 108 is removed by a suction device or an adhesive roll (neither of which are shown in the drawing), new fiber piece 108 sticks to the surface of first prepreg 101 when first prepregs 101 or the like are stacked in the thickness direction or when they are individually peeled therefrom, or with static electricity generated in handling, for example, friction in delivery or the like. Also after the removal through the sucking device or the adhesive roll, thus, a new semi-cured epoxy resin or fiber piece 108 drops out of a side surface of the prepreg or the like and sticks, as a new foreign substance, onto first protective film 102 formed on the both sides of first prepreg 101 with static electricity or the like. For this reason, a countermeasure against the static electricity is required to be taken every step in a process for manufacturing a circuit board. Also in some cases in which the static electricity of first protective film 102 is removed by an electrostatic blower or the like, moreover, it is newly charged with the static electricity in handling of a next step, stacking or individual peeling.

FIG. 1B shows a state in which first projective film 102 and first hole 103 are formed on first prepreg 101. First hole 103 may be a through hole as shown or a bottomed hole (not shown) depending on uses. Also in a processing of first hole 103 of first prepreg 101, delivery of a base material which is accompanied by the processing or handling, new fiber piece 108 sticks to the surface of first protective film 102.

FIG. 1C shows a state in which jig 104 is moved in a direction shown in arrow 107 over first protective film 102 having fiber piece 108 sticking thereto, and first hole 103 is thus filled with conductive paste 105. By raising a pressure of jig 104 against first protective film 102, it is possible to increase a push power of conductive paste 105 into first hole 103. Furthermore, fiber piece 108 on first protective film 102 can be accommodated in conductive paste 105 to form fiber piece housing paste 109. Referring to fiber piece housing paste 109 accommodating fiber piece 108 in a small amount, moreover, it is possible to push conductive paste 105 into first hole 103 by raising a pressure of jig 104 against first protective film 102 as shown in FIG. 1C.

It is desirable that jig 104 should be pushed by a certain pressure or more so as to be bonded to the surface of first protective film 102. By setting jig 104 to have the certain pressure or more, it is possible to decrease the amount of conductive paste 105 (not shown) which is left as a residue on the surface of first protective film 102. As a result, it is possible to decrease conductive paste 105 to be discarded in a sticking state to first protective film 102.

In order to decrease the amount of conductive paste 105 to be discarded in a sticking state to the surface of first protective film 102, it is desirable to certainly scrape away a conductive particle contained in conductive paste 105 so as not to be left on the surface of first protective film 102. As the conductive particle, for example, a copper particle having a particle diameter of approximately 1 μm to 10 μm is used. When the scraping is carried out over first protective film 102 by means of jig 104 more certainly, fiber piece 108 sticking onto first protective film 102 is accommodated in conductive paste 105 more greatly. In some cases, fiber piece 108 has a diameter which is equal to or greater than 1 μm, furthermore, 5 μm, or is almost equal to or greater than the particle diameter of the copper particle.

Figure 2A:
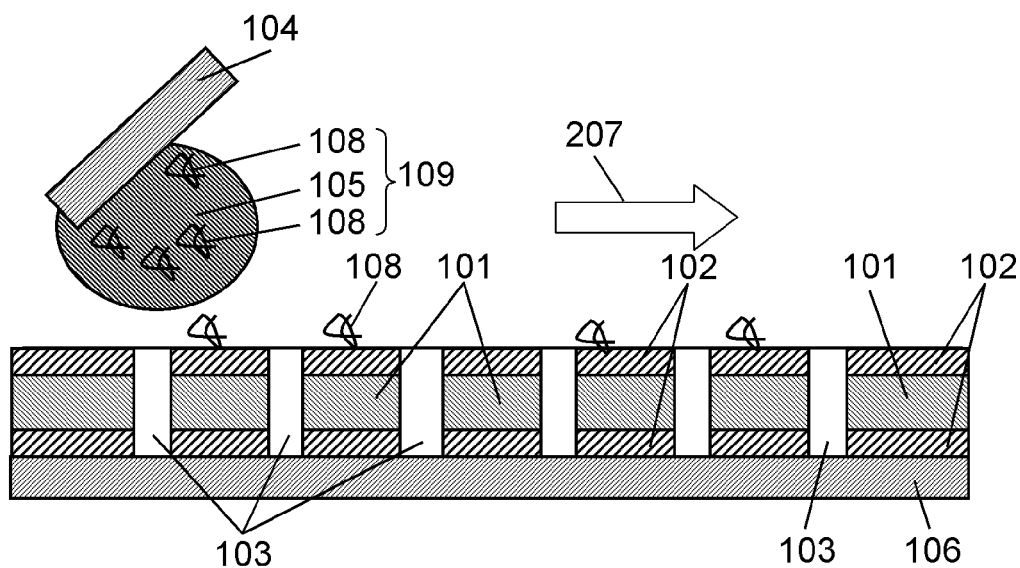
FIGS. 2A and 2B are sectional views for explaining a state in which a hole of a first prepreg is filled with the conductive paste.
Figure 2B:
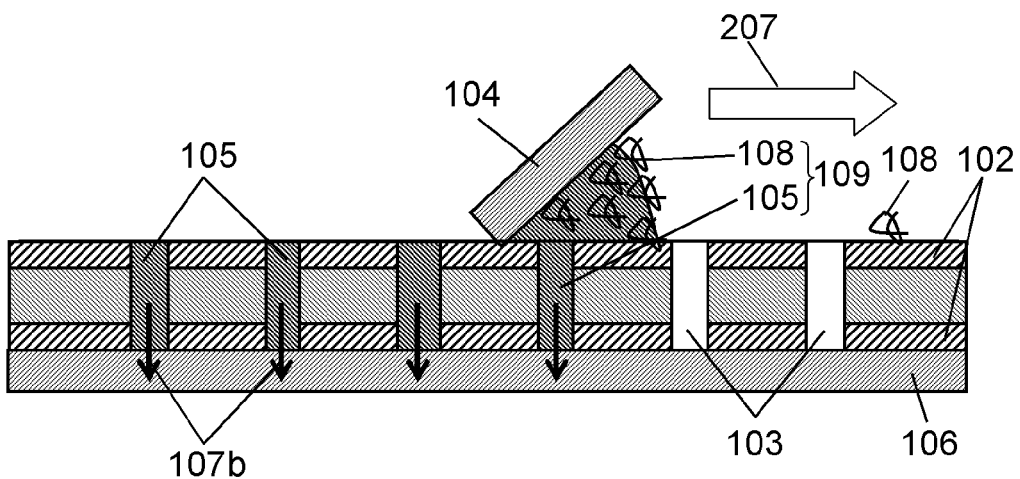

FIGS. 2A and 2B are sectional views for explaining a state in which first hole 103 of first prepreg 101 is filled with conductive paste 105. By using jig 104, fiber piece 108 is accommodated in conductive paste 105 to be filled in first hole 103 so that fiber piece housing paste 109 is formed.

As shown in FIG. 2B, jig 104 is moved in a direction shown in arrow 207 to fill first hole 103 with conductive paste 105. In FIG. 2B, it is useful to vacuum suck conductive paste 105 on base 106 side as shown in arrow 107b. In the case in which the amount of fiber piece 108 accommodated in conductive paste 105 is large, a viscosity of fiber piece housing paste 109 is increased. As a result, the filling of conductive paste 105 in first hole 103 in FIG. 2B is influenced in some cases. In those cases, a vacuum sucking hole or the like is provided on base 106 to suck conductive paste 105 into first prepreg 101 as shown in arrow 107b through a ventilation sheet (for example, a paper or the like) so that a filling property thereof can be enhanced.

In some cases in which a member having a selective permeability for a component of conductive paste 105 is used for the ventilation sheet, only a component in a part of conductive paste 105 is selectively absorbed through the ventilation sheet. For this reason, a composition of fiber piece housing paste 109 tends to be influenced. The component of conductive paste 105 includes a liquid component or a solvent component, for example. The composition of fiber piece housing paste 109 includes a solid content or a ratio of the liquid component, for example.

Figure 3A:
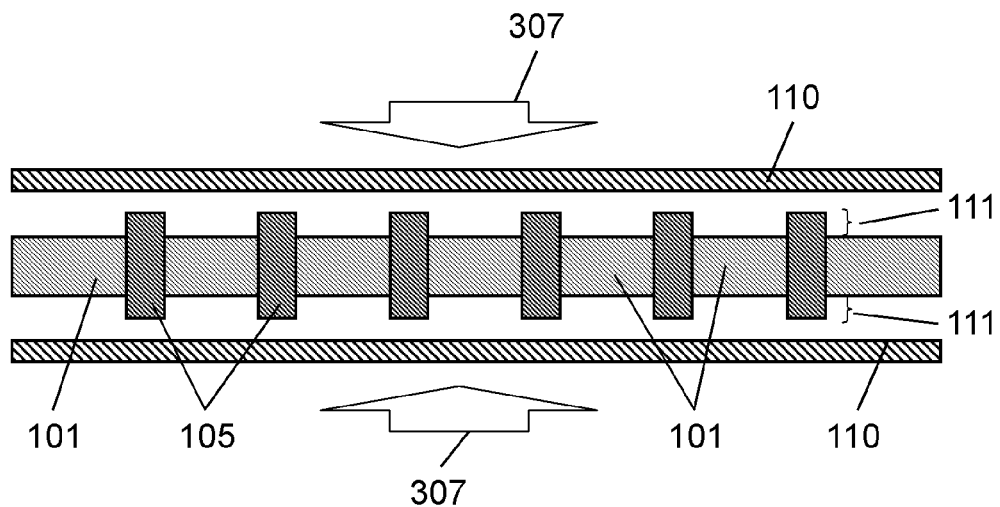
FIGS. 3A to 3C are sectional views for explaining an example of a method of manufacturing a circuit board.
Figure 3B:
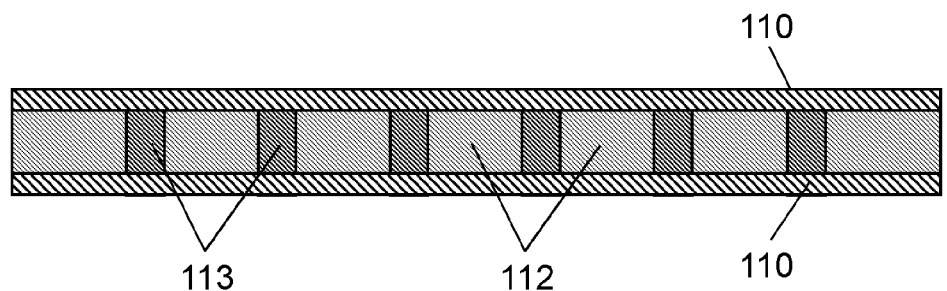
Figure 3C:
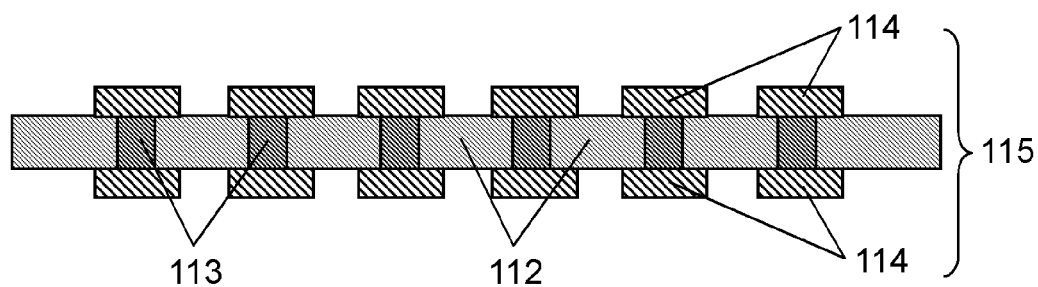

FIGS. 3A to 3C are sectional views for explaining an example of the method of manufacturing a circuit board, illustrating an example of subsequent steps to the manufacturing method of FIG. 2B.

FIG. 3A is a sectional view showing a state in which first copper foil 110 is disposed on both sides of first prepreg 101 provided with first protruded portion 111 formed by conductive paste 105. By adjusting a thickness of first protective film 102 in FIG. 2A, FIG. 2B or the like, it is possible to increase/decrease a thickness of first protruded portion 111. Copper foil 110 is disposed on the both sides of prepreg 101 provided with protruded portion 111 and pressurization and integration are carried out as shown in arrow 307 by using a press device (not shown). In the integration, it is also useful to carry out heating. By providing protruded portion 111 on conductive paste 105, it is possible to compress and bond, at a high density, the conductive powder particles contained in conductive paste 105.

FIG. 3B is a sectional view for explaining a state brought after the lamination. First insulating layer 112 is a product obtained by curing first prepreg 101. First via 113 is a product obtained by curing conductive paste 105. First via 113 is strongly pressurized and compressed corresponding to the thickness of first protruded portion 111. For this reason, metal powder particles such as copper powder particles contained in conductive paste 105 are deformed and come in face contact with each other. As a result, the via portion has a low resistance.

In FIG. 3C, first wiring 114 is formed by patterning first copper foil 110 into a predetermined shape. First circuit board 115 has first insulating layer 112, first wiring 114 fixed to the both sides of first insulating layer 112, and first via 113 for connecting first wirings 114.

By setting first circuit board 115 as a core substrate to laminate an insulating layer, a wiring or the like on the both sides, it is possible to form a multilayer.

Figure 4A:
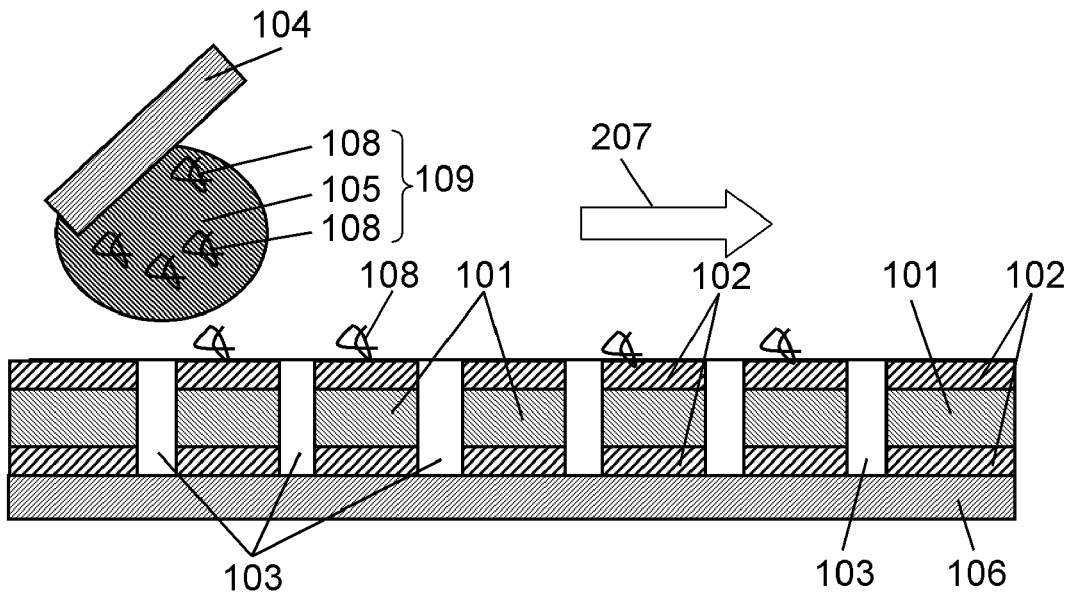
FIGS. 4A and 4B are sectional views for explaining the case in which a large number of fiber pieces are mixed into a conductive paste.
Figure 4B:
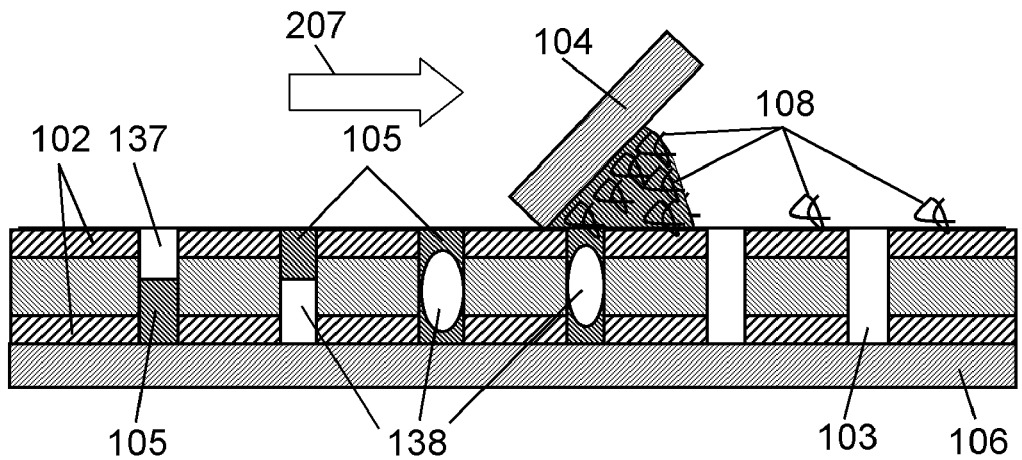

FIGS. 4A and 4B are sectional views for explaining the case in which a large number of fiber pieces 108 is mixed into conductive paste 105. In FIG. 4A, a large number of fiber pieces 108 are mixed into conductive paste 105. Every time squeegeeing is carried out over protective film 102 by means of jig 104 to which conductive paste 105 sticks, fiber piece 108 is increased on an integration basis. A part of fiber piece 108 sticking to the surface of protective film 102 at a step of filling conductive paste 105 sticks to jig 104. Moreover, fiber piece 108 which cannot completely be removed at a previous step sticks to the surface of protective film 102 where hole 103 is not filled with conductive paste 105.

FIG. 4B shows a state in which a part of fiber piece 108 sticking to protective film 102 is further mixed into conductive paste 105 when filling hole 103 formed on protective film 102 and prepreg 101 with conductive paste 105. When fiber piece 108 is mixed, a viscosity of conductive paste 105 is increased. For this reason, there is a possibility that a filling property of conductive paste 105 into hole 103 might be influenced, resulting in generation of unfilled portion 137 or air gap 138. In FIG. 4B, unfilled portion 137 indicates an insufficient filled portion in an opening state of conductive paste 105. Moreover, air gap 138 indicates an insufficient filled portion in a closing state of conductive paste 105. In some cases in which new conductive paste 105 is supplied onto unfilled portion 137 by means of jig 104, furthermore, air gap 138 is generated.

Figure 5A:
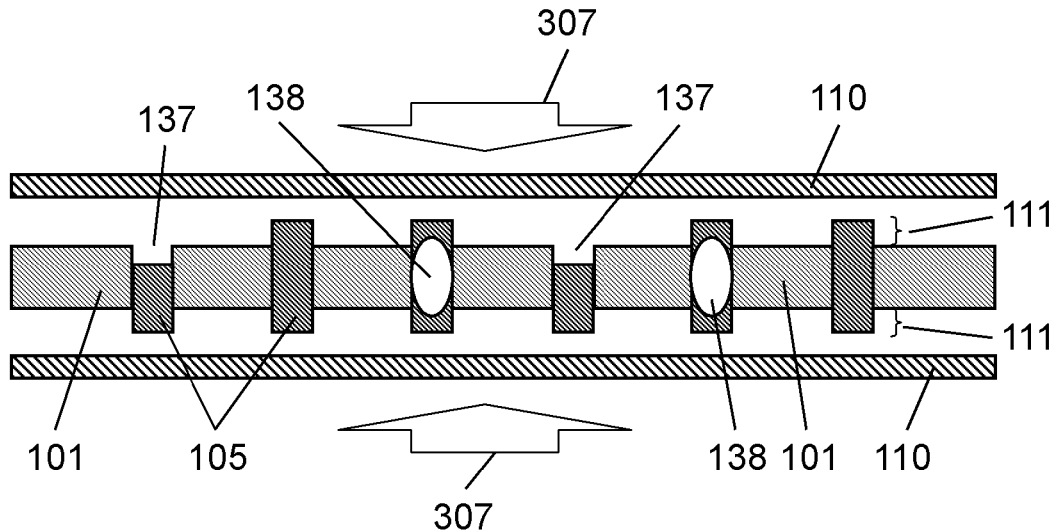
FIGS. 5A to 5C are sectional views for explaining the case in which a via constituted by the conductive paste has an unfilled portion or an air gap.
Figure 5B:
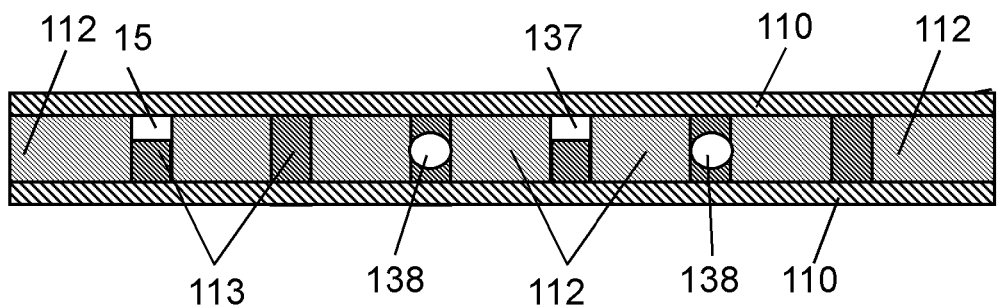
Figure 5C:
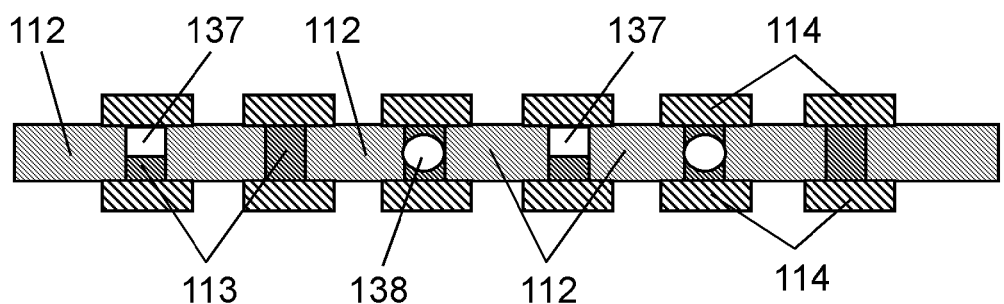

FIGS. 5A to 5C are sectional views for explaining the case in which first via 113 having conductive paste 105 formed therein has unfilled portion 137 and air gap 138. In FIG. 5A, prepreg 101 is filled with conductive paste 105 having unfilled portion 137 or air gap 138. In the case of conductive paste 105 having unfilled portion 137, the protrusion of first protruded portion 111 is reduced corresponding to unfilled portion 137. In some cases of conductive paste 105 having air gap 138, moreover, a compression force is reduced by the influence of air gap 138 in pressurization even if the protrusion of first protruded portion 111 of conductive paste 105 is sufficient.

FIG. 5B is a sectional view for explaining the influence of conductive paste 105 having unfilled portion 137 and air gap 138. FIG. 5C is a sectional view for explaining a state brought after first copper foil 110 in FIG. 5B is subjected to patterning and first wiring 114 is thus formed.

In FIGS. 5B and 5C, first insulating layer 112 is obtained by curing prepreg 101, and first via 113 is obtained by curing conductive paste 105. Unfilled portion 137 influences the contact of an interface portion between first via 113 and first copper foil 110. Moreover, air gap 138 influences an inner part of first via 113. There is a possibility that a resistance of first via 113 might be raised in respective portions. In other words, the compression of conductive paste 105 is insufficient and the contact between the metal powder particles is deficient so that a contact resistance is raised.

As described above, when hole 103 formed on prepreg 101 is filled with conductive paste 105 through protective film 102, fiber piece 108 sticking to prepreg 101 is mixed into conductive paste 105 to influence electrical characteristics in some cases. This becomes more remarkable with decrease in a diameter of the via.

Such a problem caused by fiber piece 108 rarely arises in a screen printing method which is widely used in manufacture of a circuit board or the like. The reason is that a screen printing plate (particularly, an emulsion used therein) prevents the contact of fiber piece 108 with conductive paste 105 in the case of the printing method. Also in the method of manufacturing a circuit board which connects layers through plating according to the related art, moreover, the problem rarely arises.

As shown in FIGS. 1A to 1C, FIG. 2A and FIG. 2B, when conductive paste 105 is to be subjected to squeegeeing (or to be rubbed in) over first protective film 102, fiber piece 108 sticking to first protective film 102 is mixed into conductive paste 105. Conductive paste 105 having fiber piece 108 mixed therein is changed into fiber piece housing paste 109. In the case in which the amount of fiber piece 108 accommodated in fiber piece housing paste 109 exceeds a certain amount, fiber piece 108 is conventionally discarded as a waste paste.

In recent years, increase in a density of a circuit board and reduction in a diameter of the via are demanded. If the diameter of the via is reduced more greatly, a resistance of the via or the like is influenced by the mixture of the fiber piece more easily. For this reason, the conductive paste having the fiber piece mixed therein is discarded.

Prepreg 101 contains a fiber such as glass or aramid and a resin in a semi-curing state. Since an epoxy resin in the semi-curing state is uncured, it is fragile, small and broken easily. Moreover, an opening processing for loosening a fiber is carried out in order to impregnate the fiber with the epoxy resin without an air bubble. For this reason, fiber piece 108 or a resin in a semi-curing state which sticks to a fiber tends to drop out of a side surface or a cut surface of prepreg 101.

Furthermore, the dropping resin or fiber piece 108 tends to stick to a surface of another stacked prepreg 101 with static electricity or the like. The reason is that all of prepreg 101, fiber piece 108 and the resin in the semi-curing state are insulators and are easily charged with the static electricity. Moreover, several ten prepregs 101 (taking a shape of a sheet of 500 mm×600 mm, for example) are stacked in a thickness direction before manufacture and are peeled one by one in the manufacture, and are singly processed in many cases. For this reason, prepreg 101 is easily charged with the static electricity in the stacking or peeling work, and fiber piece 108 eliminated from the side surface of prepreg 101 or the like sticks to prepreg 101. Even if fiber piece 108 is removed by means of an adhesive roll or the like at a certain step, moreover, new fiber piece 108 sticks when prepreg 101 is charged at a next step in some cases. When prepregs 101 subjected to static electricity removal are laminated and are then peeled one by one, furthermore, new static electricity is generated.

A state in which a waste paste is recycled will be described with reference to FIGS. 6 to 8.

Figure 6:
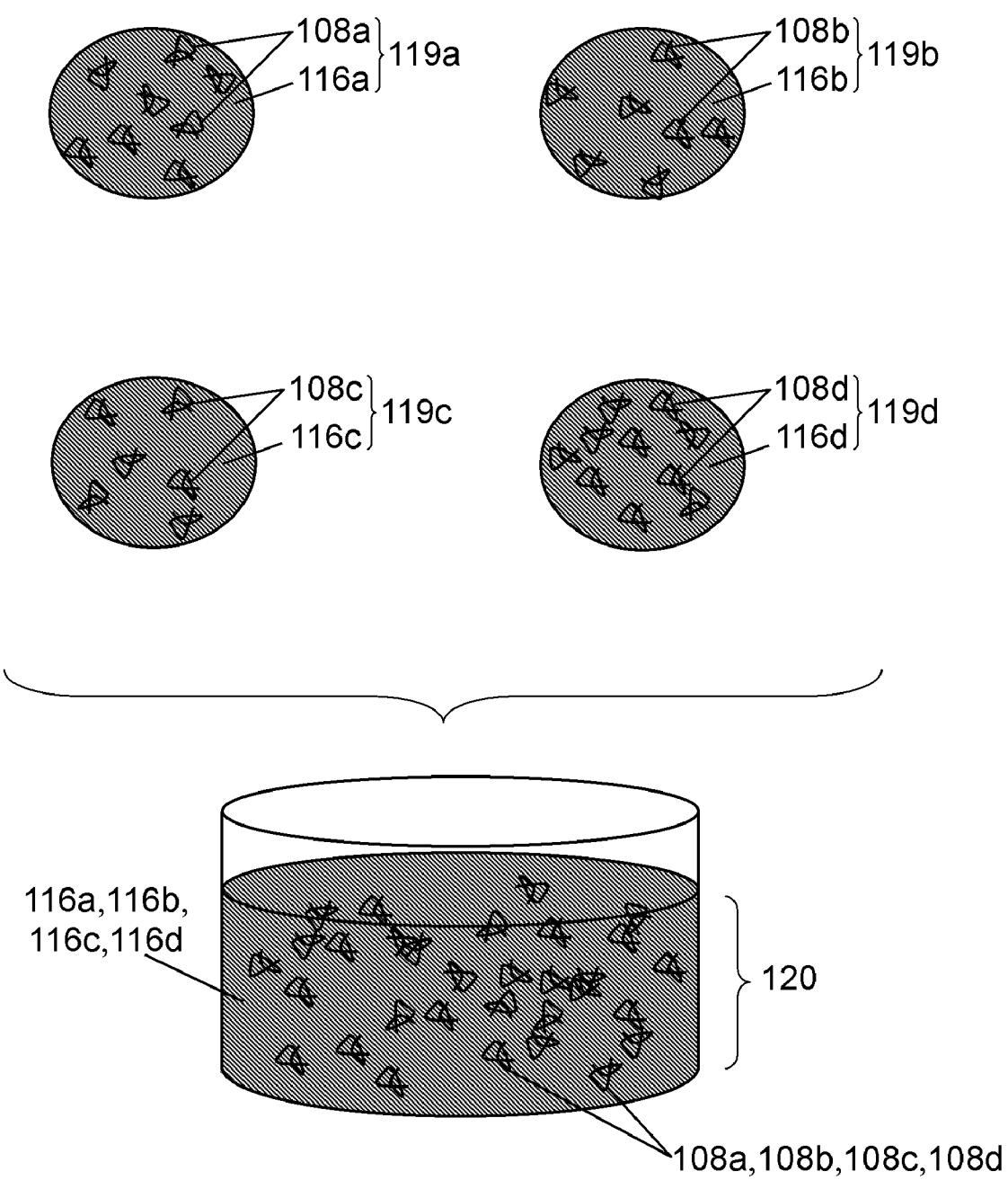
FIG. 6 is a typical view for explaining a state in which a paste which is conventionally discarded is reproduced as a reuse paste.

FIG. 6 is a typical view for explaining a state in which a paste to be discarded conventionally is reproduced and used again as a reuse paste.

Recovery pastes 119a to 119d are used at separate squeegeeing steps or separate conductive paste filling steps or are used pastes sticking to separate jigs 104, and are conventionally treated as industrial wastes.

Recovery pastes 119a to 119d have composition deviation pastes 116a to 116d in which composition deviation is generated due to squeegeeing or the like and fiber pieces 108a to 108d, respectively.

A large number of recovery pastes 119a to 119d are generated in small amounts at the respective steps. Referring to composition deviation pastes 116a to 116d included in recovery pastes 119a to 119d, moreover, a composition rate of conductive powder, a resin or the like which is contained therein deviates form a standard value in a manufacturing specification. The reason is that a composition rate or the like is varied depending on a squeegee condition (or a rub-in condition), a frequency of use of the paste, the influence of first protective film 102 or first hole 103, and the like. In addition, types or amounts of fiber pieces 108a to 108d contained in recovery pastes 119a to 119d are varied depending on a difference in a type of a base material, an environment, a processing device or a handling device, or the like.

A plurality of different lots or fiber piece housing paste 109 accommodating a plurality of fiber pieces obtained at the squeegeeing step in a large amount is recovered as a plurality of recovery pastes 119a to 119d. Then, they are collected into one so that recovered composite paste 120 is obtained.

By recovering plural types of used pastes and unifying them into one to form recovered composite paste 120, it is possible to increase an amount of reproduction per time. As a result, a cost of the reproduction can be reduced. Recovered composite paste 120 contains various fiber pieces 108a to 108d.

By recovering, as a single batch, recovery pastes 119a to 119d having different compositions from each other or the like, it is possible to reduce a waste generated at a reproducing step.

Even if recovery pastes 119a to 119d can be recovered in a small amount, that is, approximately 10 g to 50 g every lot, it is possible to increase the amount of recovered composite paste 120 to be 1 kg to 10 kg or more by periodically collecting a plurality of small lots if necessary. As a result, it is possible to increase a yield in recycling, thereby reducing a processing cost. Herein, the plural number indicates 10 to 100 lots or more, for example.

Figure 7:
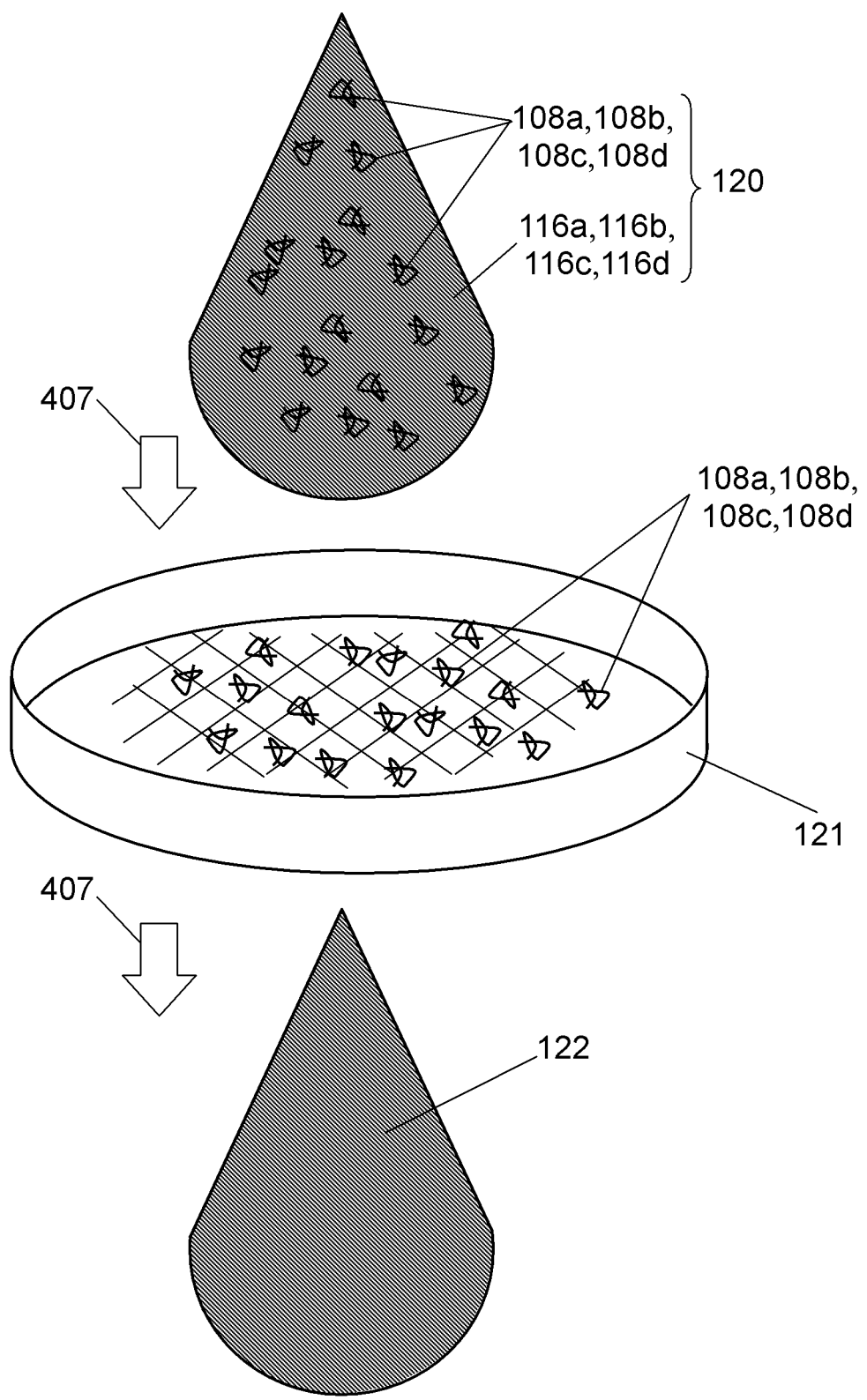
FIG. 7 is a typical view for explaining a state in which a recovered composite paste is filtered and a filtered recovery paste is thus manufactured.

FIG. 7 is a typical view for explaining a state in which recovered composite paste 120 is filtered to manufacture filtered recovery paste 122. As filter 121, a mesh formed of stainless, polyester or the like is used. Various fiber pieces 108a to 108d mixed into recovered composite paste 120 are removed by filter 121. In other words, recovered composite paste 120 is filtered in a direction of arrow 407 so that filtered recovery paste 122 is obtained. At the filtering step, it is possible to increase a filtering speed by using vacuum suction, a rotary push-in blade or screw, a pressure pump for a slurry, a diaphragm pump and the like (which are not shown) together. As the vacuum suction, for example, there is used a vacuum pump, an aspirator for reducing a pressure by the Venturi effect utilizing a fluid, or the like.

At the step of filtering recovered composite paste 120, it is desirable to regulate an opening size of filter 121. More specifically, it is desirable to set the opening size of filter 121 to be three times as great as an average diameter of a metal particle contained in recovered composite paste 120 or more and to be twenty times as great as an average diameter of a fiber constituting first prepreg 101 or less, and furthermore, ten times or less, and furthermore, five times or less. The reason is as follows. In the case in which a fiber such as a glass fiber is contained as a foreign substance in recovered composite paste 120, a length of the glass fiber to be the foreign substance is twenty times as great as an average diameter of the glass fiber or more, and furthermore, fifty times or more.

By adding an organic solvent in a small amount or the like to recovered composite paste 120 if necessary, moreover, it is possible to reduce a viscosity of recovered composite paste 120. As a result, a filter working property of filter 121 can be enhanced. Furthermore, it is preferable that the organic solvent added for filtering or the like should be properly taken away from a solvent to be added later to filtered recovery paste 122 or the like correspondingly if necessary. Thus, recovered composite paste 120 in a paste state is filtered as it is.

Figure 8:
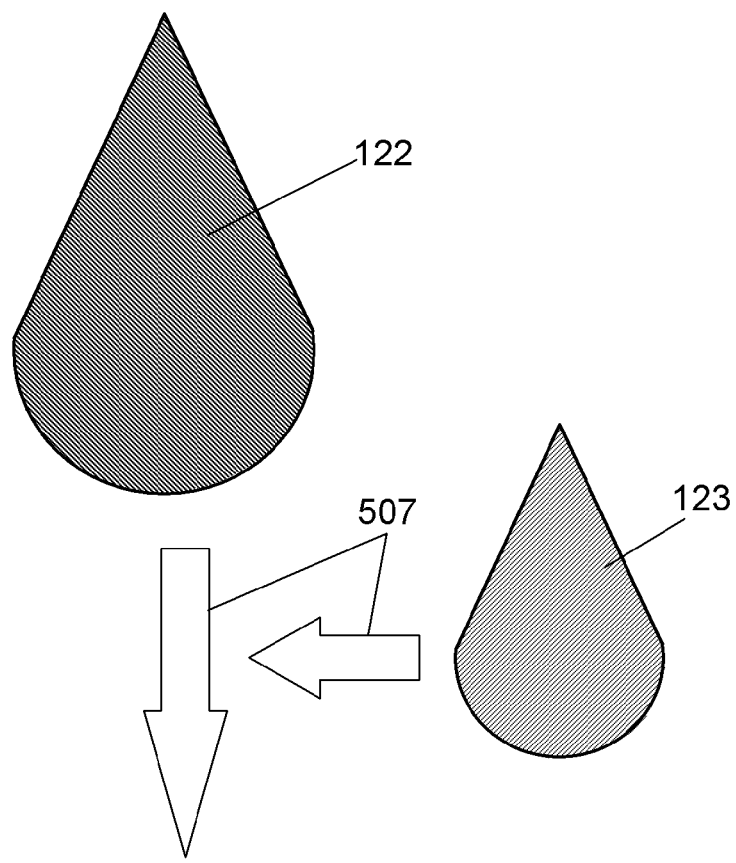
FIG. 8 is a typical view for explaining a state in which a solvent or the like is added to the filtered recovery paste and is thus manufactured as a reuse paste.
Figure 8:
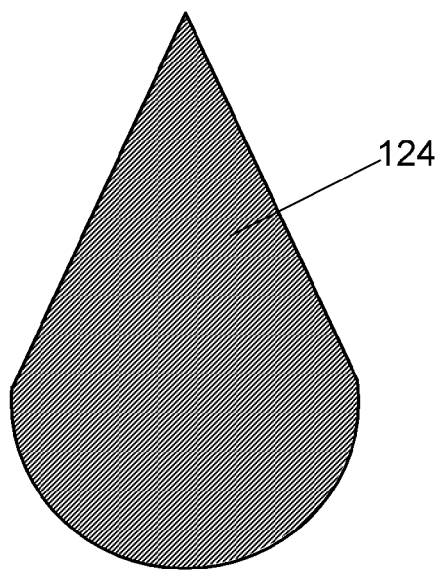

FIG. 8 is a typical view for explaining a state in which solvent or the like 123 is added to filtered recovery paste 122 to manufacture reuse paste 124.

Solvent or the like 123 is at least one of a solvent, a resin and a paste having a different composition from the filtered recovery paste. Solvent or the like 123 may be added and mixed at a time or separately at plural times. After a viscosity is reduced, moreover, filtering may be carried out to obtain filtered recovery paste 122. Reuse paste 124 is a conductive paste which is reproduced for reuse by removing fiber piece 108 from the used conductive paste without influencing a shape of copper powder contained therein or the like. It is useful to adjust reuse paste 124 to have a composition, a solid content, a viscosity or the like which is almost identical to new conductive paste 105 described with reference to FIG. 1C or the like. However, reuse paste 124 contains a very small fiber piece or the like which is not contained in new conductive paste 105 in some cases. For this reason, it is useful to cause a difference between conductive paste 105 and reuse paste 124 to be clear through analysis. Herein, the very small fiber piece or the like has a length which is almost equal to a diameter thereof or is approximately a double of the diameter, for example.

Solvent or the like 123 may be a liquid thermosetting resin or other conductive pastes in addition to an organic solvent. In the case in which the conductive paste is used as solvent or the like 123, it is useful to utilize the other conductive paste having a viscosity or a composition ratio which is different from that of conductive paste 105 described with reference to FIG. 1C or the like. A composition ratio of the conductive paste contained in filtered recovery paste 122 is greatly deviated from a viscosity, a composition ratio or the like of initial conductive paste 105. In order to correct the deviation, it is desirable to add the other conductive paste having a viscosity or a composition ratio which is different from that of initial conductive paste 105.

It is useful to utilize a kneading device (for example, a planetary mixer or a roll kneading device) in order to mix filtered recovery paste 122 with solvent or the like 123.

Herein, it is desirable to use a viscometer for adjusting a viscosity (or measuring the viscosity). Moreover, it is desirable to use a solid content meter for adjusting a composition ratio (or measuring the composition ratio) or to use a thermal analysis device (which is referred to as DSC, TG, DTA or the like). In the case in which the metal powder contained in recovery pastes 119a to 119d is a base metal (for example, copper), moreover, it is useful to measure and adjust the composition ratio through thermogravimetry (TG) in a nitrogen atmosphere in order to prevent the influence of oxidation of the metal powder.

The composition ratio indicates an amount of metal powder in a paste (weight %), an amount of a volatile matter in a paste (weight %), an amount of an organic matter in a paste or the like. Moreover, a specific gravity of the paste is greatly influenced by a content rate of a metal contained in the paste. For this reason, reference may be made to the specific gravity of the paste. In the case in which the specific gravity is measured, it is also possible to use a floating method, pychnometry, a vibration type density meter, a balance method or the like based on JIS K 0061 (a method of measuring a density and a specific gravity of a chemical product). In the case in which a pycnometer method is used, a specific gravity bottle put on the market may be utilized. Herein, a Wadon type, Gay-Lussac type, LeCharite type or JIS K 2249 Harvard type specific gravity bottle is used for measuring specific gravities of liquid and semisolid road tars having comparatively high viscosities. In the case of a paste having a high viscosity, moreover, it is also useful to originally make a specific gravity bottle itself. In the case in which a specific gravity bottle having a volume of approximately 1 cc to 100 cc is originally made, it is useful to utilize a metallic material such as stainless. By originally making a specific gravity bottle made of stainless or the like, it is possible to prevent a damage during measurement or in handling or the like and to carry out wipe cleaning through a solvent or the like.

Next, a state in which a second circuit board is manufactured by using reuse paste 124 thus fabricated will be described with reference to FIGS. 9A to 11C. The second circuit board uses reuse paste 124 obtained by reproducing, as shown in FIGS. 6 to 8, conductive paste 105 used for fabricating the first circuit board, that is, conductive paste 105 which is conventionally discarded due to the mixture of a large number of fiber pieces 108.

FIGS. 9A to 11C are sectional views for explaining the state in which the second circuit board is manufactured by using reuse paste 124.

Figure 9A:
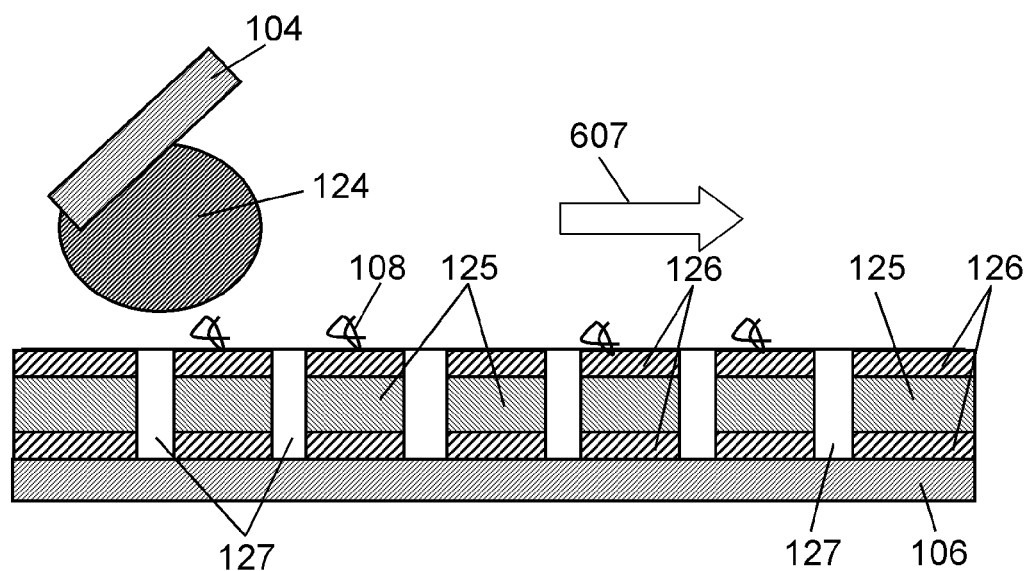
FIGS. 9A and 9B are sectional views for explaining a state in which a second hole formed on a second prepreg is filled with the reuse paste through a second protective film.
Figure 9B:
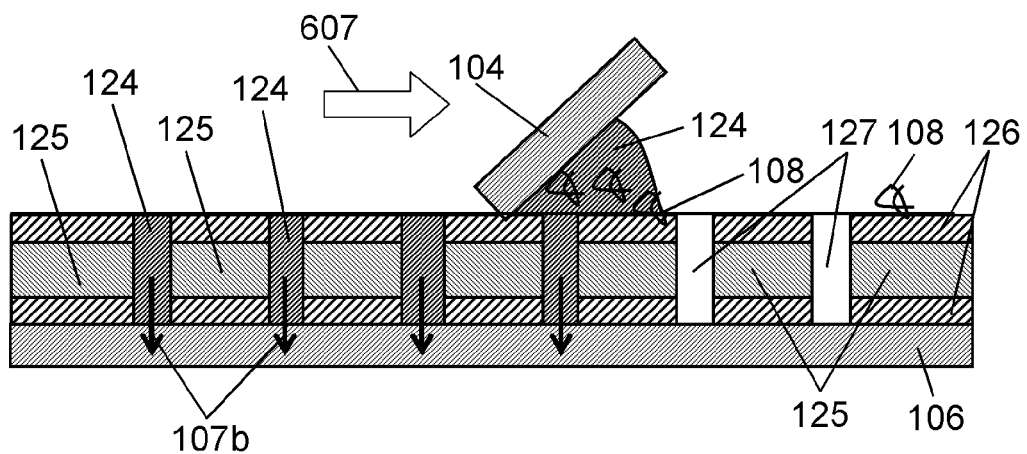

FIGS. 9A and 9B are sectional views for explaining a state in which second hole 127 formed on second prepreg 125 is filled with a reuse paste through a second protective film. In FIG. 9A, second prepreg 125 is formed in a semi-curing state (that is, a B stage state) by impregnation of a glass woven fabric, a glass non-woven fabric, an aramid woven fabric or an aramid non-woven fabric with an epoxy resin or the like. Second projecting film 126 is a PET film or the like. Second hole 127 can be formed by a carbon dioxide laser device or the like. First prepreg 101 and second prepreg 125 may be of the same type of the same manufacturer. First circuit board 115 formed by curing first prepreg 101 is thermally cured before second circuit board 133 is formed by curing second prepreg 125. Reuse paste 124 to be used in first prepreg 101 and second prepreg 125 may be set into an identical lot or different lots. In other words, "first" and "second" in first prepreg 101 and second prepreg 125 indicate "before" and "after" the step, respectively. In the present embodiment, reuse paste 124 is used for second prepreg 125 to fabricate second circuit board 133. However, reuse paste 124 may be used for first prepreg 101 to fabricate first circuit board 115.

Second protective film 126 is applied to both sides of second prepreg 125. In some cases, fiber piece 108 such as a glass fiber sticks to a surface of second protective film 126. In some cases, fiber piece 108 cannot be completely removed by means of a sucking device or an adhesive roll (neither of which are shown).

As illustrated in FIG. 9B, jig 104 is moved in a direction shown in arrow 607 over second protective film 126 to which fiber piece 108 sticks and second hole 127 is thus filled with reuse paste 124. As shown in FIG. 9B, by increasing a contact pressure (or a pushing pressure) of jig 104 against second protective film 126, it is possible to accommodate fiber piece 108 on second protective film 126 in reuse paste 124. Also in the case in which fiber piece 108 is accommodated in reuse paste 124, fiber piece 108 can be removed as shown in FIGS. 6 to 8. As a result, it is possible to fabricate a second reuse paste (not shown), and furthermore, a third reuse paste (not shown), thereby repeating recycle of the paste. By repeating the reuse of conductive paste 105, thus, it is possible to reduce an amount of industrial wastes to be discarded as a waste paste. Therefore, it is possible to take a countermeasure against an environment and to reduce a manufacturing cost. The reuse of conductive paste 105 indicates removal of fiber piece 108 or the like and readjustment of composition of conductive paste 105 without influencing a shape or dispersion state of metal powder contained in conductive paste 105.

Figure 10A:
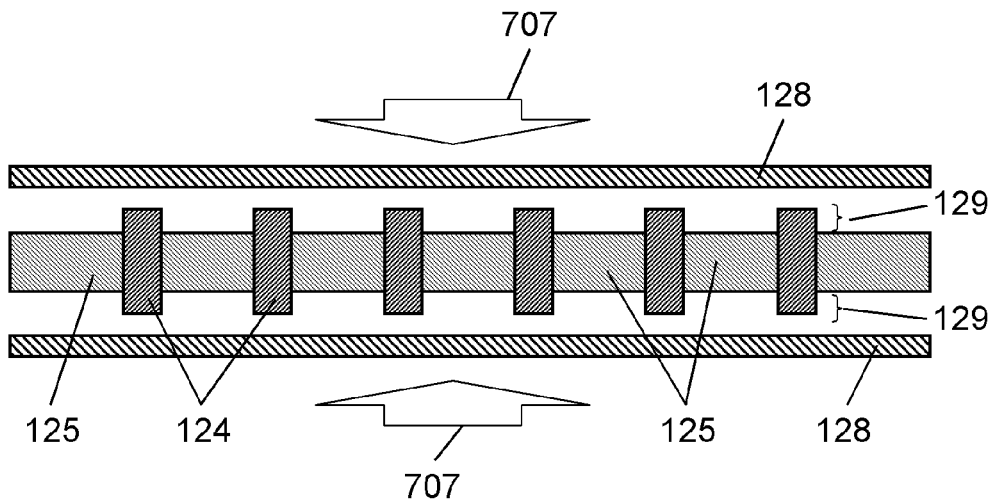
FIGS. 10A to 10C are sectional views for explaining a state in which a second circuit board is manufactured by using the reuse paste.
Figure 10B:
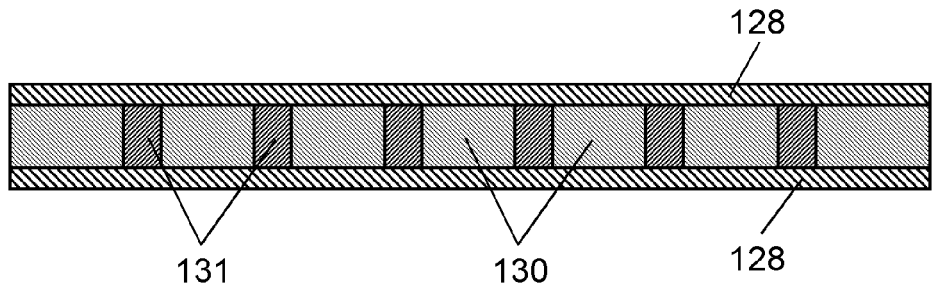
Figure 10C:
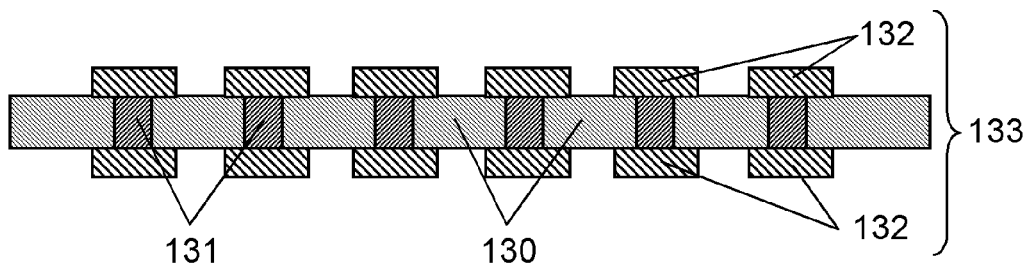

FIGS. 10A to 10C are sectional views for explaining a state in which a second circuit board is manufactured by using reuse paste 124. In FIG. 10A, second protruded portion 129 constituted by reuse paste 124 is formed on second prepreg 125. Second copper foil 128 is provided on both sides of second prepreg 125.

By carrying out pressurization (and furthermore, desirably heating) in a direction shown in arrow 707, a state shown in FIG. 10B is brought. As shown in FIG. 10B, reuse paste 124 is compressed and cured so that second via 131 is formed, and furthermore, second prepreg 125 is cured so that second insulating layer 130 is formed.

Second copper foil 128 shown in FIG. 10B is formed into a predetermined pattern through etching or the like so that second wiring 132 in FIG. 10C is obtained. Thus, second circuit board 133 is manufactured.

Figure 11A:
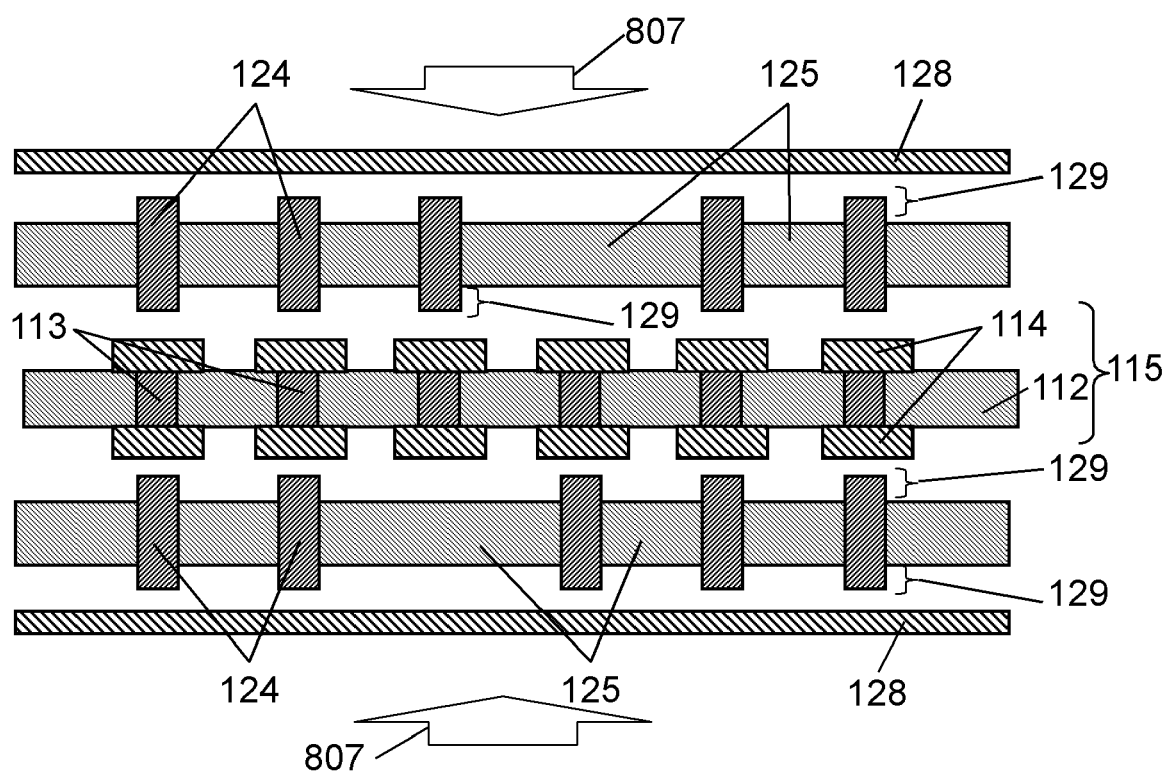
FIGS. 11A to 11C are views for explaining a method of manufacturing a multilayer having four wiring layers.
Figure 11B:
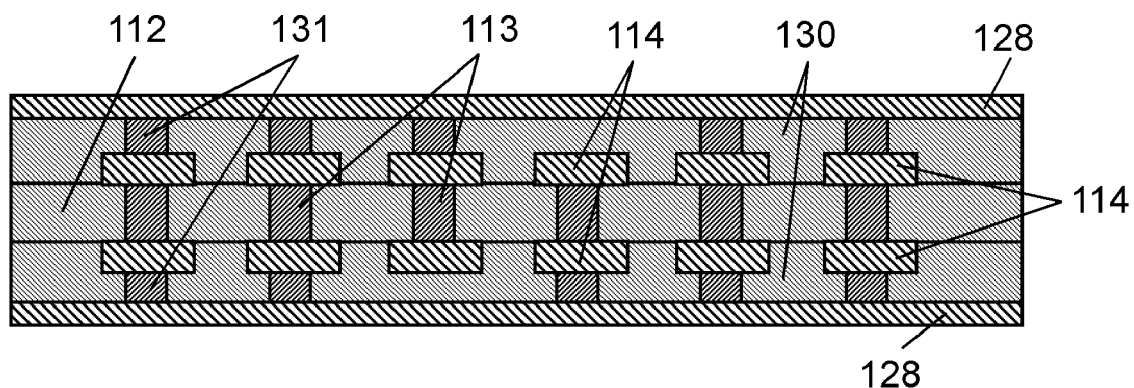
Figure 11C:
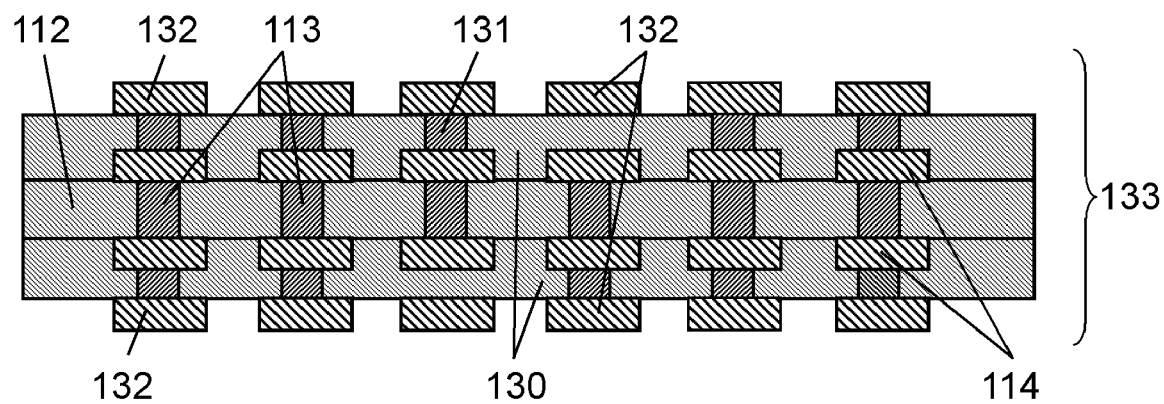

FIGS. 11A to 11C are views for explaining a method of manufacturing a multilayer board having four wiring layers. As shown in FIG. 11A, second prepreg 125 having second protruded portion 129 and second copper foil 128 are set onto both sides of first wiring board 115, and pressurization and integration are carried out in a direction of arrow 807. In the pressurization, heating may be performed.

FIG. 11B is a sectional view showing a state in which second prepreg 125 is cured so that second insulating layer 130 is obtained. Then, second copper foil 128 on a surface layer is etched into second wiring 132 so that second wiring board 133 shown in FIG. 11C is obtained. By repeating the steps, moreover, it is possible to further make a multilayer.

Figure 12A:
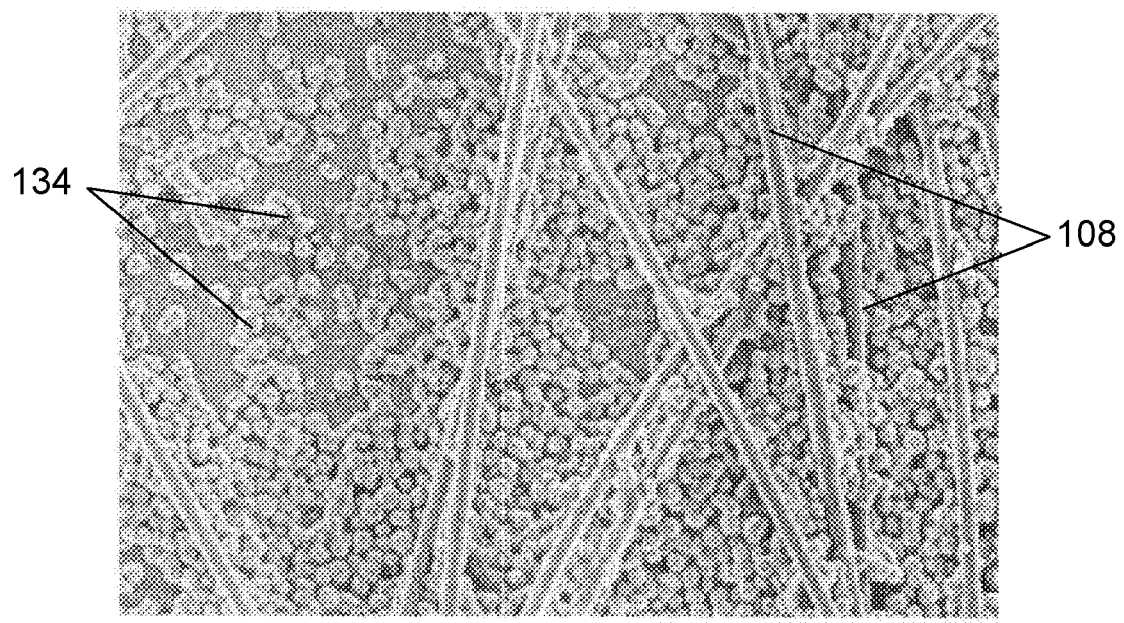
FIG. 12A is a view showing an SEM observation image of the recovery paste.
Figure 12B:
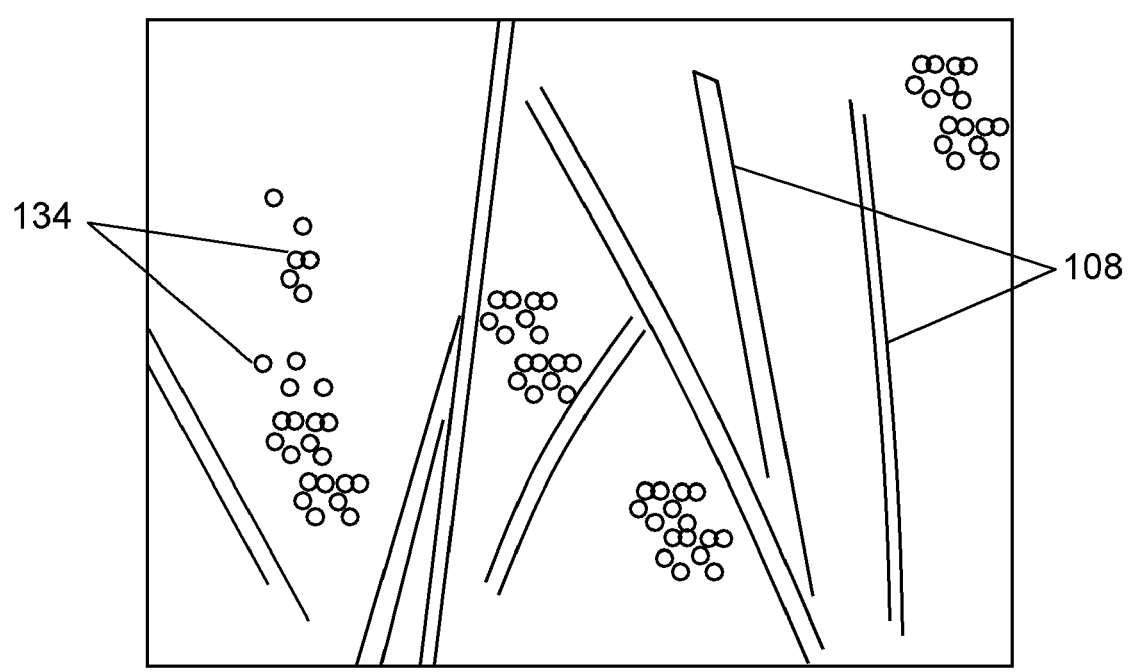
FIGS. 12B is a typical view of FIG. 12A.

Referring to FIGS. 12A and 12B, next, recovery pastes 119a to 119d will be described in more detail with reference to a view showing an SEM observation image.

FIGS. 12A and 12B are a view showing an SEM observation image of a part of the recovery paste and a typical view thereof. Recovery pastes 119a to 119d contain metal powder 134 constituted by copper powder or the like and fiber piece 108 constituted by a glass fiber or the like.

A particle diameter or shape of metal powder 134, a particle size distribution or the like can be optimized depending on respective uses. As shown in FIGS. 12A and 12B, the particle diameter of metal powder 134 is almost equal to a diameter of fiber piece 108. Moreover, a length of fiber piece 108 is approximately five times as great as the diameter (or ten times or more). In other words, fiber piece 108 is extended in a length direction as compared with the diameter. Furthermore, particulate metal powder 134 takes a spherical shape in which a diameter and a length are almost equal to each other. In the present embodiment, a difference between the shapes of fiber piece 108 and metal powder 134 is utilized.

In the present embodiment, waste paste to be conventionally discarded is recovered and collected as recovery pastes 119a to 119d to form recovered composite paste 120. Fiber piece 108 is selectively removed from recovered composite paste 120; a viscosity, a solid content, a composition ratio or the like is adjusted, and reproduction is carried out to obtain a reuse paste so that a circuit board is manufactured.

In the present embodiment, fiber piece housing pastes 109 generated at the steps in FIGS. 1A to 3C to be the steps of manufacturing first circuit board 115, that is, recovery pastes 119a to 119d having fiber piece 108 mixed therein as shown in FIGS. 12A and 12B are reproduced at the steps shown in FIGS. 6 to 8. Then, reuse paste 124 is utilized in the process for manufacturing second circuit board 133 as shown in FIGS. 9A to 11C.

Figure 13A:
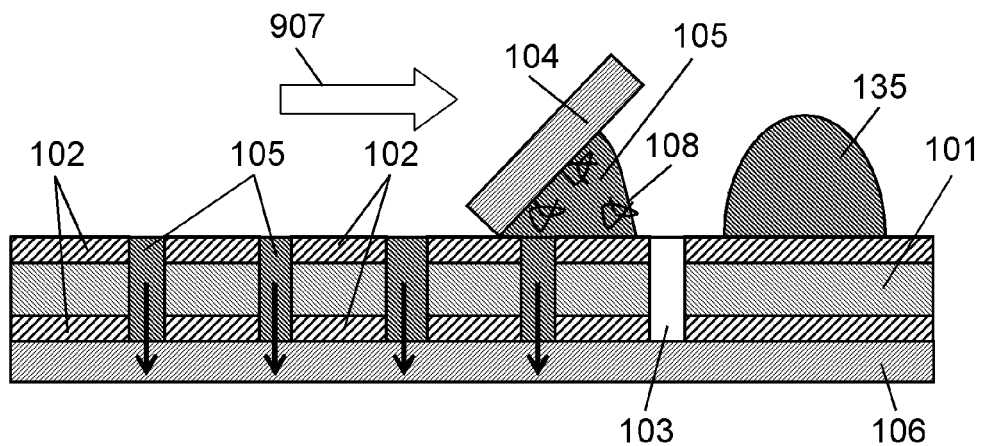
FIGS. 13A to 13C are typical views for explaining an experiment example of a conductive paste according to a comparative example.
Figure 13B:
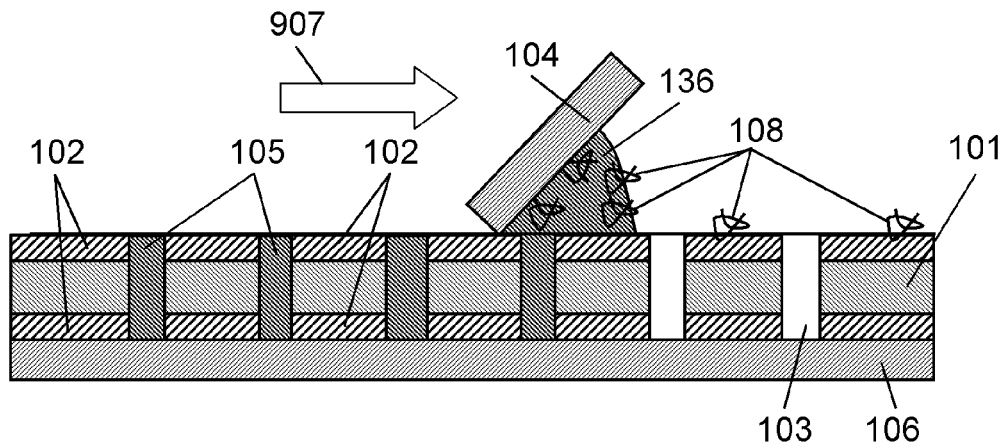
Figure 13C:
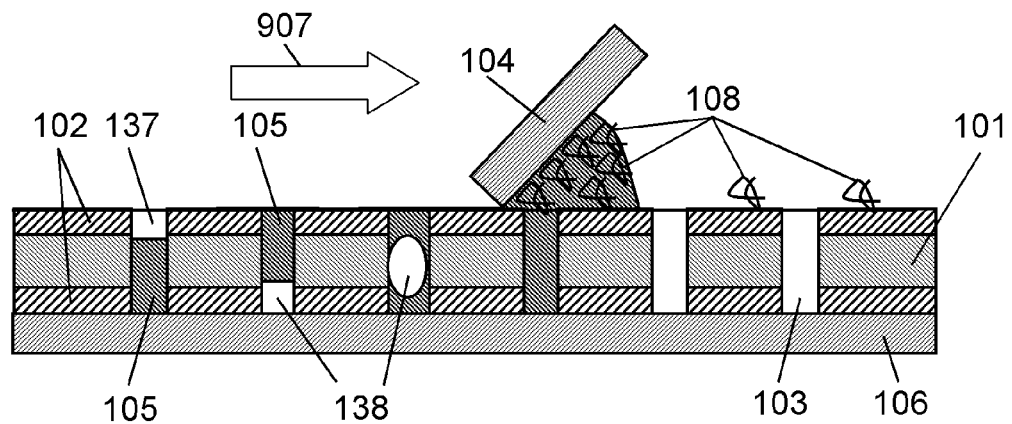
Figure 14A:
FIGS. 14A to 14D are sectional views for explaining a conventional method of manufacturing a circuit board using a conductive paste.
Figure 14B:
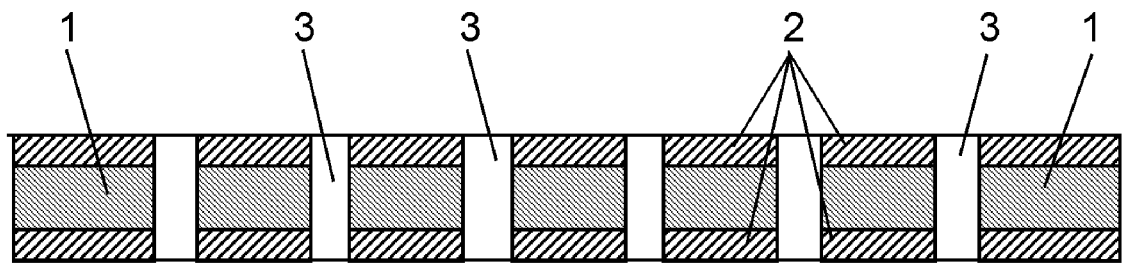
Figure 14C:
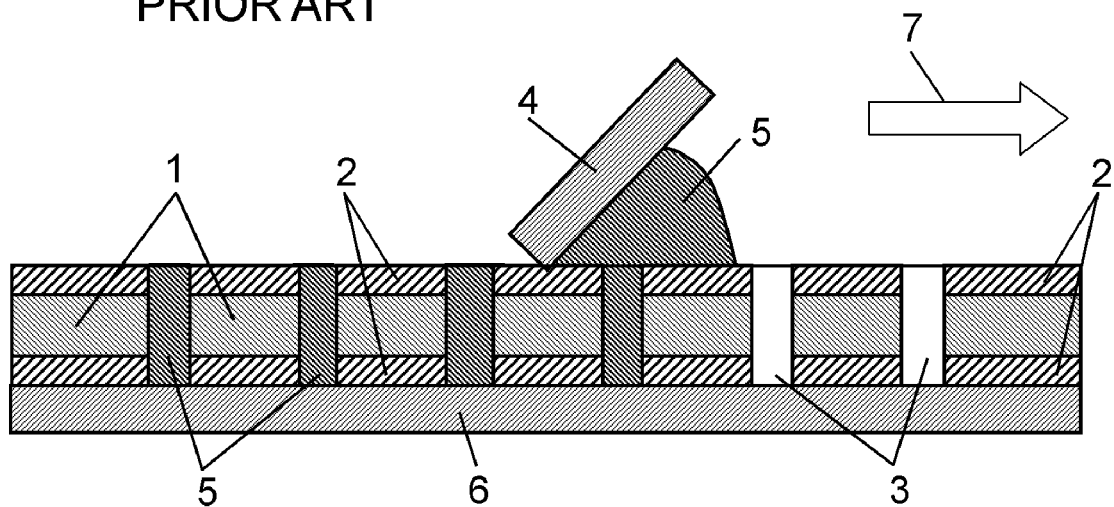
Figure 14D:
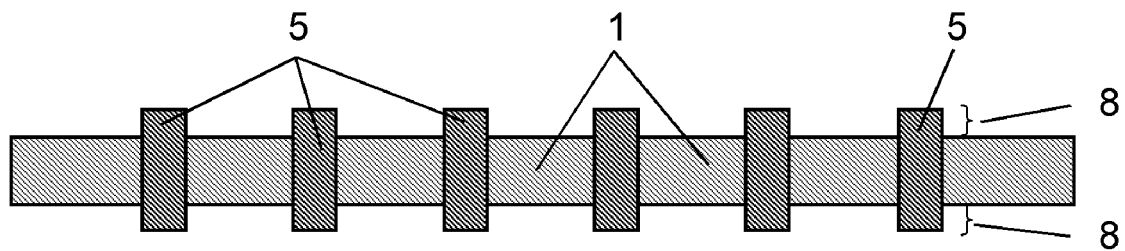
Figure 15A:
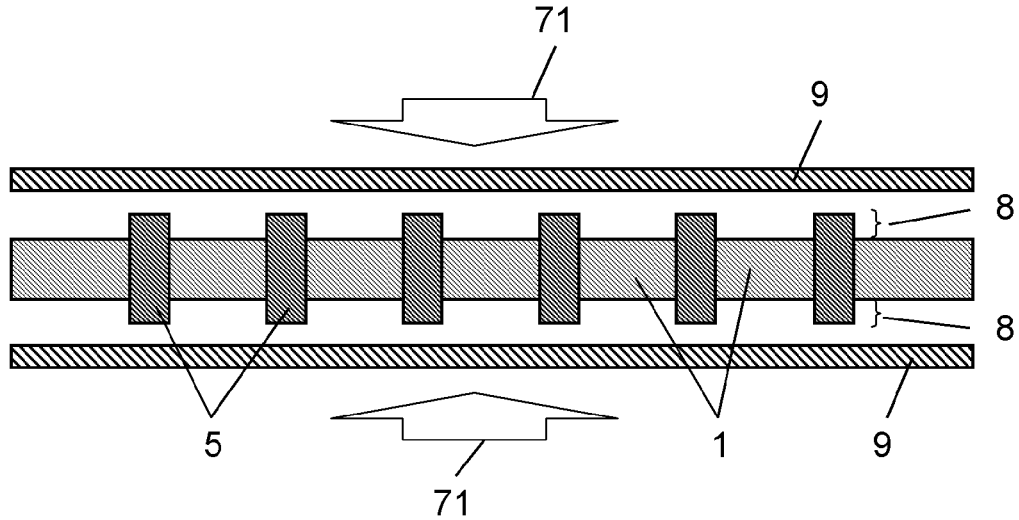
FIGS. 15A to 15C are sectional views for explaining a method of manufacturing a double-sided board using a conductive paste, illustrating subsequent steps to FIG. 14.
Figure 15B:
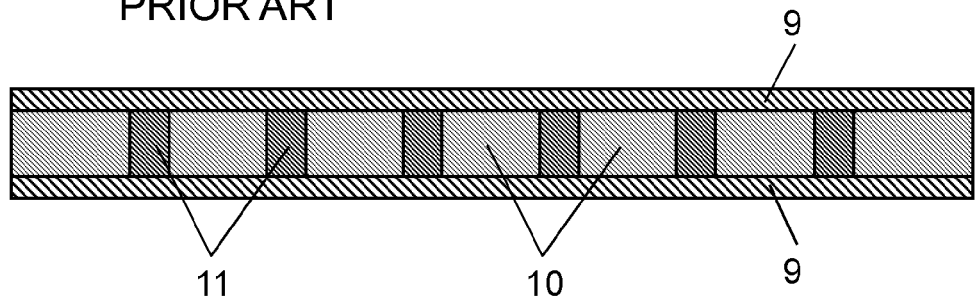
Figure 15C:
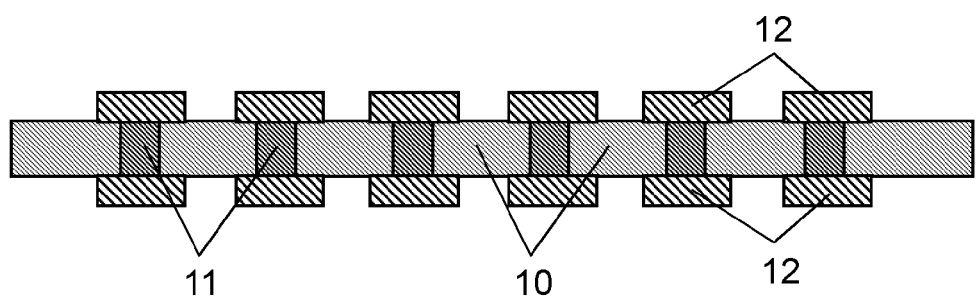

FIGS. 13A to 13C are typical views for explaining filling of a conductive paste according to a comparative example. Prepreg 101 having hole 103 formed thereon is fixed to base 106, and jig 104 is moved in a direction of arrow 907 to fill hole 103 with conductive paste 105.

In FIG. 13A, fiber piece 108 sticking onto first protective film 102 is mixed into conductive paste 105. As a result, a viscosity is higher than a normalized value in a manufacturing specification. Additional paste 135 is used for reducing a viscosity, and the viscosity of additional paste 135 is lower than that of conductive paste 105 to be added.

FIG. 13B is a sectional view showing a state in which additional paste 135 having a lower viscosity than conductive paste 105 having a higher viscosity than the normalized value is added to conductive paste 105. Added paste 136 is obtained by adding additional paste 135 having a lower viscosity than the normalized value to conductive paste 105 having the higher viscosity than the normalized value in the manufacturing specification. A viscosity of added paste 136 is in a range of the normalized value in the manufacturing specification through the addition of additional paste 135. It is also possible to include a composition ratio of a paste within the normalized value in the manufacturing specification as well as the viscosity range by addition of additional paste 135.

FIG. 13C is a typical view for explaining a problem caused by added paste 136.

As shown in FIG. 13C, unfilled portion 137 or air gap 138 is generated when first hole 103 formed on first prepreg 101 is filled with additional paste 136 in some cases. The reason is supposed as follows. As shown in FIG. 13, a large number of fiber pieces 108 are mixed in added paste 136. Even if additional paste 135 is simply added, it is impossible to exclude the influence of fiber piece 108 mixed in conductive paste 105.

Reuse according to the present embodiment will be described below. The present invention does not propose the simple reuse of a used conductive paste but any of technical ideas utilizing a natural law which is advanced for the reuse. It is supposed that reduction in the amount of discard of the conductive paste, and furthermore, the reuse thereof in the present invention correspond to reuse, that is, reuse with the same object as that in the beginning including continuous use in EU (for example, the WEE directive, Article 7).

In the EU (for example, the WEE directive, Article 7), particularly, recycle is divided into two parts, that is, recovery and disposal. Moreover, the recovery is divided into three parts, that is, reuse, recycling and energy recovery. Herein, the disposal implies redemption or reclamation. The reuse implies that use is carried out again for the same object as that in the beginning including the continuous use. The recycle implies that a waste material is reprocessed at a producing step for the object in the beginning or the other object. The energy recovery implies energy recovery through direct combustion accompanied by thermal recovery.

The present embodiment corresponds to recovery based on the EU recycle definition and is useful for reduction in wastes or the like or reduction in consumption of resource energy or the like.

Even if a conductive paste is simply mixed into a conductive paste which is used (or is being used) over a metal mask having a smaller opening portion than a printed body, a fiber piece or the like which is mixed (stored) into the conductive paste cannot be removed. For this reason, the used conductive paste (or the conductive paste to be reused) according to the present embodiment is recovered to an outside of a printing machine through a metal mask provided around the printed body or the like.

In the present embodiment, the used conductive paste is taken out (or recovered) through the metal mask provided around the printed body or the like (and furthermore, a used printing machine, squeegee or the like), and the conductive paste is recycled (particularly, reused) on the outside of the printing machine (or another place, another device). Thus, the used conductive paste is taken out so that the used conductive pastes generated in a plurality of different print lots on different days and times are efficiently recovered and are thus collected into a single large lot (1 kg or more, 5 kg or more, and furthermore, 10 kg or more). Therefore, it is possible to enhance efficiency and a yield of the recycle (particularly, reuse) of the conductive paste. The used conductive paste is generated in a small amount (for example, less than 1 kg, and furthermore, 500 g to 50 g) after the end of print. In the case in which the print is carried out by using the squeegee, the conductive paste is scattered discontinuously over a straight contact surface of the squeegee and the printed body so that filling into a hold formed on a prepreg cannot be carried out if the amount of the conductive paste is decreased. By collecting a plurality of conductive pastes in small amounts to increase the amount (1 kg or more, and furthermore, 10 kg or more) in place of the recovery in the small amount, it is possible to remove a fiber piece or the like in the used paste with high efficiency.

According to the present embodiment, the recovered conductive paste is reproduced to enable reuse with a dispersion state of a conductive particle maintained as it is, and an advanced technical idea is proposed.

The present embodiment will be described below in more detail. Tables 1 to 5 indicate an example of a result obtained by an experiment for the effects in the present embodiment.

The Tables 1 to 5 indicate diameters of holes formed on a prepreg and the number of the holes, and a defect ratio in the case in which the number of printed sheets is varied. Moreover, a right end of the table indicates a viscosity for each number of printed sheets. By using a rheometer of a cone plate type, an apparent viscosity at 0.5 rpm is measured. A unit of the viscosity is Pa·s. A diameter of a cone of the rheometer of the cone plate type is 25 mm and a cone angle is 2 degrees. A measuring temperature of a sample is 25° C. A measurement of the viscosity or the like is based on JIS K7117-2.

On a prepreg (500 mm×600 mm) are formed 50000 holes in total, that is, 10000 holes having a diameter of 80 μm, 10000 holes having a diameter of 100 μm, 10000 holes having a diameter of 130 μm, 10000 holes having a diameter of 150 μm, and 10000 holes having a diameter of 200 μm. The Table 1 shows results obtained by evaluating them using a test pattern capable of carrying out evaluation in a single prepreg. In the Table 1, the number of vias which have conduction defect is measured in 10000 holes. There is not used a via chain pattern which is generally utilized widely, that is, a test pattern for measuring whether at least one of 10000 continuous vias is disconnected or not. In the case in which 10000 vias having the diameter of 130 μm are formed, moreover, a yield obtained in print of 350 sheets is set to be 1.0 as normalization. For this reason, a unit is not given to the defect ratio in the Table 1. In the Table 1, φ represents a diameter of a hole.

TABLE 1

| Number of printed sheets (number) | φ80 μm × 10000 | φ100 μm × 10000 | φ130 μm × 10000 | φ150 μm × 10000 | φ200 μm × 10000 | Viscosity (Pa·s) |
|---|---|---|---|---|---|---|
| 50 | 0 | 0 | 0 | 0 | 0 | 20 |
| 100 | 0 | 0 | 0 | 0 | 0 | 32 |
| 150 | 0 | 0 | 0 | 0 | 0 | 42 |
| 200 | 0 | 0 | 0 | 0 | 0 | 69 |
| 250 | 0 | 0 | 0 | 0 | 0 | 89 |
| 300 | 7.5 | 1.7 | 0 | 0 | 0 | 137 |
| 350 | 14.5 | 5.8 | 1.0 (normalized value) | 0 | 0 | 169 |
| 400 | 33.2 | 9.9 | 3.8 | 1.2 | 0 | 247 |
| 450 | 63.9 | 21.4 | 10.3 | 3.8 | 0.9 | 511 |

From the result for the 50th printed sheet in the Table 1, a defect is not generated in the case of the holes having the diameters of 80 μm to 200 μm. At that time, the viscosity is 20 (Pa·s).

From the result for the 250th printed sheet in the Table 1, the defect is not generated in the case of the holes having the diameters of 80 μm to 200 μm. At that time, the viscosity is 89 (Pa·s). It is apparent that the viscosity is increased when the number of the printed sheets is increased.

From the result for the 300th printed sheet in the Table 1, the defect ratio is 7.5 in the case of the hole having the diameter of 80 μm, and the defect ratio is 1.7 in the case of the hole having the diameter of 100 μm. The defect is not generated in the case of the holes having the diameters of 130 μm to 200 μm. As described above, it is apparent that the number of the printed sheets is increased to 300 so that the defect ratio is increased when the diameter of the hole is decreased. Moreover, the viscosity is 137 (Pa·s) when the number of the printed sheets is 300, and the defect is not generated for the 300th sheet in the case of the holes having the diameters 130 μm to 200 μm. The defect is generated when the diameter of the hole is equal to or smaller than 100 μm, and the defect is not generated when the diameter of the hole is equal to or larger than 130 μm. The reason is supposed as follows. The holes having the diameters of 130 μm to 200 μm have larger diameters than the diameters of 80 μm to 100 μm. Also in the case in which the viscosity of the conductive paste is increased to 137 (Pa·s), therefore, the conductive paste can be reliably filled into the holes.

From the result for 350 printed sheets in the Table 1, the defect ratio is 14.5 in the case of 10000 holes having the diameter of 80 μm, is 5.8 in the case of 10000 holes having the diameter of 100 μm, and is 1.0 in the case of 10000 holes having the diameter of 130 μm (which value is normalized to be 1.0). In the case of the holes having the diameters of 150 μm and 200 μm, the defect ratio is zero. The reason is supposed as follows. Irrespective of further increase in the viscosity of the paste to 169 (Pa·s), the diameter of the hole is large, that is, 150 μm or more. Therefore, the conductive paste can reliably be filled into the hole.

From the result for 400 printed sheets in the Table 1, the defect ratio is 33.2 in the case of 10000 holes having the diameter of 80 μm, is 9.9 in the case of 10000 holes having the diameter of 100 μm, is 3.8 in the case of 10000 holes having the diameter of 130 μm, and is 1.2 in the case of 10000 holes having the diameter of 150 μm. In the case of the hole having the diameter of 200 μm, the defect ratio is zero. The reason is supposed as follows. Irrespective of further increase in the viscosity of the paste to 247 (Pa·s), the diameter of the hole is large, that is, 200 μm. Therefore, the conductive paste can reliably be filled into the hole.

From the result for 450 printed sheets in the Table 1, the defect ratio is 63.9 in the case of 10000 holes having the diameter of 80 μm, is 21.4 in the case of 10000 holes having the diameter of 100 μm, is 10.3 in the case of 10000 holes having the diameter of 130 μm, is 3.8 in the case of 10000 holes having the diameter of 150 μm, and is 0.9 in the case of 10000 holes having the diameter of 200 μm. Also in the case of the hole having the diameter of 200 μm, the defect is generated. The reason is supposed as follows. When 450 sheets are printed, an ink viscosity is greatly increased to 511 (Pa·s). Although the diameter of the hole is large, that is, 200 μm, therefore, the conductive paste cannot be completely filled into the hole in some cases.

In the case in which the number of the sheets is equal to or larger than a certain number, conventionally, the conductive paste is discarded irrespective of the diameter of the hole. Also in the used conductive paste in which the defect is generated in a small hole having the diameter of 80 μm, the defect is not generated in a comparatively large hole having the diameter of 200 μm in some cases. However, a conductive paste which can be used by selecting a diameter of a hole is also discarded conventionally in many cases.

In the present embodiment, the conductive paste exceeding the number of the printed sheets, that is, 450 in the Table 1 which are conventionally discarded is recovered as recovery pastes 119a to 119d. Furthermore, the conductive paste is united with a used conductive paste in another lot to prepare approximately 10 kg of recovered composite paste 120. Viscosities of individual recovery pastes 119a to 119d are greatly varied to be approximately 600 to 800 (Pa·s).

In order to remove fiber piece 108 mixed into recovered composite paste 120 and formed of a glass fiber having a length of 100 μm or more, therefore, filter 121 having 100 meshes is used to carry out filtering as shown in FIG. 7 so that filtered recovery paste 122 is obtained.

As shown in FIG. 8, then, the viscosity is adjusted. By using thermogravimetry (TG) or the like, moreover, a degree of composition deviation in the conductive paste is measured and solvent or the like 123 is added to adjust the viscosity against the composition deviation. Thereafter, the conductive paste is set to be a reuse conductive paste for a first time of reproduction, and the same print experiment as that in the Table 1 is carried out. The result is shown in Table 2. In the Table 2, for example, the number of the printed sheets of 450+50=500 is described in a first line, which implies that 50 sheets are printed as a reuse conductive paste at a first time. In other words, even if 50 sheets are printed newly as the reuse conductive paste at the first time, it is implied that 450 sheets have already been printed previously (that is, when the conductive paste is brand-new). The fact that 50 sheets are printed with the reuse conductive paste at the first time corresponds to the print of 50+450=500 sheets in total.

TABLE 2

| Number of printed sheets (number) | φ80 μm × 10000 | φ100 μm × 10000 | φ130 μm × 10000 | φ150 μm × 10000 | φ200 μm × 10000 | Viscosity (Pa · s) |
|---|---|---|---|---|---|---|
| 450 + 50 = 500 | 0 | 0 | 0 | 0 | 0 | 29 |
| 450 + 100 = 550 | 0 | 0 | 0 | 0 | 0 | 51 |
| 450 + 150 = 600 | 0 | 0 | 0 | 0 | 0 | 74 |
| 450 + 200 = 650 | 0 | 0 | 0 | 0 | 0 | 100 |
| 450 + 250 = 700 | 6.5 | 1.2 | 0 | 0 | 0 | 125 |
| 450 + 300 = 750 | 20.0 | 10.5 | 1.6 | 0.1 | 0 | 212 |
| 450 + 350 = 800 | 33.3 | 16.5 | 7.9 | 1.6 | 0.1 | 345 |
| 450 + 400 = 850 | 66.7 | 30.6 | 21.3 | 12.5 | 1.2 | 500 |
| 450 + 450 = 900 | 200.0 | 76.7 | 36.5 | 14.1 | 2.3 | 714 |

Description will be given to a column of the number of the printed sheets of 450 (the number of the printed sheets in a brand-new product)+200 (the number of the printed sheets as a reuse paste)=650 (the total number of the printed sheets) in the Table 2. Also in a reuse conductive paste at a first time for reuse, the defect is not generated in the number of the printed sheets of 200 or less when the holes having the diameters of 80 μm to 200 μm are used. Also in the reuse conductive paste at the first time for reuse, the number of the printed sheets of 200 corresponds to that 650 sheets are actually printed because 450 sheets have already been printed in the brand-new product.

In the case of the hole having the diameter of 80 μm, the defect ratio is 63.9 when the number of the printed sheets is 450 in the Table 1, and the defect ratio is zero when the number of the printed sheets is 450+200=650 in the Table 2. In the present embodiment, thus, by using a small diameter of 80 μm in which the defect ratio tends to be increased, it is possible to sharply decrease the defect ratio also in the case in which the number of the printed sheets is increased.

Next, description will be given to a column of the number of the printed sheets of 450 (the number of the printed sheets in a brand-new product)+400 (the number of the printed sheets as a reuse paste)=850 (the total number of the printed sheets) in the Table 2. In the reuse conductive paste at a first time for reuse, when the number of the printed sheets is 400, the defect ratio is 66.7 in the case of the hole having the diameter of 80 μm, is 30.6 in the case of the hole having the diameter of 100 μm, is 21.3 in the case of the hole having the diameter of 130 μm, is 12.5 in the case of the hole having the diameter of 150 μm, and is 1.2 in the case of the hole having the diameter of 200 μm. Referring to the reuse conductive paste, it is also apparent that the defect ratio is particularly increased more greatly with a smaller diameter of the hole when the number of the printed sheets is increased.

However, the result of the Table 2 is obtained after 450 sheets are printed in the brand-new product. As compared with the Table 1, therefore, it is apparent that the number of the printed sheets is increased to be almost a double.

Next, description will be given to a column of the number of the printed sheets of 450 (the number of the printed sheets in the brand-new product)+450 (the number of the printed sheets as the reuse paste)=900 (the total number of the printed sheets) in the Table 2. Also in the reuse conductive paste at the first time for reuse, after 450 sheets are printed (900 sheets in total), the defect ratio is increased.

For this reason, the conductive paste carrying out the print for 900 sheets in total is set to be recovered composite paste 120 as shown in FIG. 6, and filtering is performed to obtain filtered recovery paste 122 as shown in FIG. 7 by using filter 121 having 100 meshes in order to remove fiber piece 108. As shown in FIG. 8, then, a viscosity is adjusted. Moreover, the thermogravimetry (TG) or the like is used to measure the degree of the composition deviation in the conductive paste, and solvent 123 or the like is added to adjust the viscosity against the composition deviation. This is set to be a reuse conductive paste at a second time for reuse. The reuse paste at the second time for reuse is utilized to carry out the same print experiment as that in the Table 1. The result is shown in Table 3.

TABLE 3

| Number of printed sheets (number) | φ80 μm × 10000 | φ100 μm × 10000 | φ130 μm × 10000 | φ150 μm × 10000 | φ200 μm × 10000 | Viscosity (Pa · s) |
|---|---|---|---|---|---|---|
| 900 + 50 = 950 | 0 | 0 | 0 | 0 | 0 | 51 |
| 900 + 100 = 1000 | 0 | 0 | 0 | 0 | 0 | 69 |
| 900 + 150 = 1050 | 0 | 0 | 0 | 0 | 0 | 110 |
| 900 + 200 = 1100 | 4.6 | 0.7 | 0 | 0 | 0 | 158 |
| 900 + 250 = 1150 | 12.5 | 9.4 | 2.7 | 0.7 | 0 | 215 |
| 900 + 300 = 1200 | 30.6 | 21.2 | 7.3 | 4.5 | 0.2 | 348 |
| 900 + 350 = 1250 | 82.7 | 56.5 | 17.8 | 11.6 | 1.2 | 501 |
| 900 + 400 = 1300 | 273.7 | 160.7 | 39.9 | 19.9 | 2.3 | 811 |
| 900 + 450 = 1350 | 650.5 | 283.4 | 69.9 | 58.1 | 3.2 | Not measured |

Description will be given to a column of the number of the printed sheets of 900 (the number of the printed sheets in a brand-new product+the number of the printed sheets at a first time for reproduction)+150 (the number of the printed sheets as a reuse paste at a second time for reproduction)=1050 (the total number of the printed sheets) in the Table 3. Also in a reuse conductive paste at the second time for reuse, a defect is not generated in the number of the printed sheets of 150 or less when the holes having the diameters of 80 μm to 200 μm are used. The number of the printed sheets of 150 with the reuse conductive paste at the second time for reuse corresponds to that 1050 sheets are actually printed because 450 printed sheets are completed as the reuse paste at the first time for reuse in the brand-new product.

As described above, it is apparent that the conductive paste generating the defect ratio with the increase in the number of the printed sheets can also be used for manufacturing a printed circuit board repetitively through repetition of the reproduction processing shown in FIGS. 6 to 8.

With reference to Tables 4 and 5, next, description will be given to the case in which a finer mesh (400 meshes) is used for filter 121 (see FIG. 7). By using the fine mesh, it is possible to selectively remove fiber piece 108 such as a glass fiber having a length of 20 μm to 30 μm or more.

By causing the mesh to be fine, it is possible to further increase a removal ratio of fiber piece 108 or the like which is mixed into recovered composite paste 120 (see FIG. 7). However, a time required for filtering is prolonged so that a yield obtained through the filtration is reduced in some cases. Therefore, utilization for different purposes is useful.

By combining a plurality of filters 121 having different meshes, moreover, it is possible to cause clogging with difficulty. In addition, the mesh does not need to be restricted to a shape of a net but it is also possible to use surface filtration, depth filtration, cake filtration (a glass fiber or the like deposited on a surface of a filter is set to be a cake, and the cake is utilized as a filter) or the like. For such a filtering material or filtering equipment, it is useful to improve a commercial product.

In order to remove fiber piece 108 mixed into recovered composite paste 120, filter 121 having 400 meshes is used to carry out the filtration as shown in FIG. 7 so that filtered recovery paste 122 is obtained.

As shown in FIG. 8, then, the viscosity is adjusted. By using thermogravimetry (TG) or the like, moreover, a degree of composition deviation in the conductive paste is measured and solvent or the like 123 is added to adjust the viscosity against the composition deviation. Thereafter, the conductive paste is set to be a reuse conductive paste at a first time for reproduction, and the same print experiment as that in the Table 1 is carried out. The result is shown in the Table 4. In the Table 4, for example, the number of the printed sheets of 450+50=500 is described in a first line, which implies that 50 sheets are printed as a reuse conductive paste at the first time. In other words, even if 50 sheets are printed newly as the reuse conductive paste at the first time, it is implied that 450 sheets have already been printed previously (that is, when the conductive paste is brand-new). The fact that 50 sheets are printed with the reuse conductive paste at the first time corresponds to the print of 50+450=500 sheets in total.

TABLE 4

| Number of printed sheets (number) | φ80 μm × 10000 | φ100 μm × 10000 | φ130 μm × 10000 | φ150 μm × 10000 | φ200 μm × 10000 | Viscosity (Pa · s) |
|---|---|---|---|---|---|---|
| 450 + 50 = 500 | 0 | 0 | 0 | 0 | 0 | 23 |
| 450 + 100 = 550 | 0 | 0 | 0 | 0 | 0 | 33 |
| 450 + 150 = 600 | 0 | 0 | 0 | 0 | 0 | 42 |
| 450 + 200 = 650 | 0 | 0 | 0 | 0 | 0 | 65 |
| 450 + 250 = 700 | 0 | 0 | 0 | 0 | 0 | 92 |
| 450 + 300 = 750 | 10.1 | 0.7 | 0 | 0 | 0 | 132 |
| 450 + 350 = 800 | 13.4 | 4.6 | 1.1 | 0 | 0 | 174 |
| 450 + 400 = 850 | 34.1 | 9.9 | 4.6 | 1.6 | 0 | 251 |
| 450 + 450 = 900 | 56.1 | 24.3 | 10.9 | 2.6 | 0.5 | 515 |

Description will be given to a column of the number of the printed sheets of 450 (the number of the printed sheets in the brand-new product)+250 (the number of the printed sheets as a reuse paste for 400-mesh filtration)=700 (the total number of the printed sheets) in the Table 4. The defect is not generated in the number of the printed sheets of 250 (the total number of the printed sheets of 700) or less when the holes having the diameters of 80 μm to 200 μm are used. Because fine filter 121 having 400 meshes is used for the filtration, moreover, it is possible to further lessen the glass fibers remaining in the reuse paste. For this reason, it is also possible to suppress a rise in the viscosity.

TABLE 5

| Number of printed sheets (number) | φ80 μm × 10000 | φ100 μm × 10000 | φ130 μm × 10000 | φ150 μm × 10000 | φ200 μm × 10000 | Viscosity (Pa · s) |
|---|---|---|---|---|---|---|
| 900 + 50 = 950 | 0 | 0 | 0 | 0 | 0 | 25 |
| 900 + 100 = 1000 | 0 | 0 | 0 | 0 | 0 | 35 |
| 900 + 150 = 1050 | 0 | 0 | 0 | 0 | 0 | 41 |
| 900 + 200 = 1100 | 0 | 0 | 0 | 0 | 0 | 70 |
| 900 + 250 = 1150 | 0 | 0 | 0 | 0 | 0 | 98 |
| 900 + 300 = 1200 | 7.3 | 0 | 0 | 0 | 0 | 140 |
| 900 + 350 = 1250 | 12.7 | 6.3 | 0.7 | 0 | 0 | 180 |
| 900 + 400 = 1300 | 29.4 | 12.5 | 5.9 | 0.7 | 0 | 259 |
| 900 + 450 = 1350 | 52.6 | 20.7 | 9.8 | 4.0 | 1.3 | 518 |

Description will be given to a column of the number of the printed sheets of 900 (the number of the printed sheets in the brand-new product+a first time for reproduction)+250 (the number of the printed sheets as a reuse paste for 400-mesh filtration)=1150 (the total number of the printed sheets) in the Table 5. The defect is not generated in the number of the printed sheets 250 (the total number of the printed sheets of 1150) or less irrespective of repetition of the reproduction twice when the holes having the diameters of 80 μm to 200 μm are used. Because fine filter 121 having 400 meshes is used for the filtration, it is possible to further lessen the glass fibers remaining in the reuse paste. For this reason, it is also possible to suppress a rise in the viscosity.

As described above in the present embodiment, conductive paste 105 is recycled, and furthermore, reused. Consequently, it is possible to decrease the waste paste.

Moreover, fiber piece 108 is formed of a glass constituting first prepreg 101 or second prepreg 125 in many cases. For this reason, it is desirable that the opening diameter of filter 121 to be used in the filtering step should be three times as large as the average particle diameter of the metal particle contained in the conductive paste or more and should be equal to or smaller than twenty times as large as the average diameter of the fiber, moreover, ten times or less, and furthermore, five times or less. In the case in which the opening diameter of filter 121 is equal to or smaller than a double of the average particle diameter of the metal particle, filter 121 tends to be clogged. In some cases in which the opening diameter of filter 121 is larger than thirty times as large as the average diameter of the fiber, moreover, fiber piece 108 having a small length cannot be filtered completely. The opening diameter of filter 121, the average particle diameter of the metal particle, the diameter of the fiber or the like can be observed and measured through SEM or the like.

In first prepreg 101 and second prepreg 125, it is useful to vary at least one of a thickness of the prepreg itself and the number and density of glass fibers or aramid fibers constituting the prepreg (a weave, a density, the number of fibers, or the like). By using the prepregs having thicknesses, the numbers of fibers constituting the prepregs, densities or the like which are different from each other, it is possible to obtain various circuit boards.

According to the present invention, it is possible to suppress deterioration in a yield due to the influence of a fiber piece mixed into a conductive paste in a circuit board using the conductive paste for connection of layers. In addition, it is possible to reuse the conductive paste having the fiber piece mixed therein. Therefore, it is possible to considerably cut down a cost of a material for the circuit board and to reduce an amount of wastes.

What is claimed is:

1. A method of manufacturing a circuit board, comprising:
a sticking step of sticking a protective film to a surface of a prepreg containing a fiber and a resin in a semi-curing state;
a holing step of forming a hole on the prepreg through the protective film;
an applying step of applying a conductive paste onto the protective film;
a filling step of filling the hole with a part of the conductive paste;
a peeling step of peeling the protective film to constitute, on the surface of the prepreg, a protruded portion formed of the conductive paste;
a pressurizing step of providing a copper foil on both sides of the prepreg and carrying out pressurization by using a press device;
a curing step of curing the prepreg and the conductive paste in a heating step subsequent to the pressurizing step;
a patterning step of processing the copper foil into a wiring pattern;
a first sticking step of sticking a first protective film to a surface of a first prepreg;
a first holing step of forming a first hole on the first prepreg through a first protective film;
a first applying step of applying the conductive paste onto the first protective film;
a filling step of filling the first hole with a part of the conductive paste;
a recovering step of collecting a plurality of conductive pastes which is not filled in the first hole and recovering the conductive pastes as a recovery paste;
a filtering step of filtering the recovery paste to obtain a filtered recovery paste;
an adjusting step of adding and mixing at least one of a solvent, a resin and a paste having a different composition from the filtered recovery paste into the filtered recovery paste to adjust at least a viscosity or a solid content, for obtaining a reuse paste;
a second sticking step of sticking a second protective film to a surface of a second prepreg;
a second holing step of forming a second hole on the second prepreg through the second protective film;
a second applying step of applying the reuse paste onto the second protective film; and
a filling step of filling the second hole with a part of the reuse paste,
wherein the recovery paste in a paste state is filtered and a foreign substance containing a fiber piece taken away from the prepreg is removed to obtain the filtered recovery paste.

2. The method of manufacturing a circuit board according to claim 1, wherein at least one of a solvent, a resin and a paste having a different composition from the filtered recovery paste is added to and mixed with the recovery paste for lowering a viscosity, and filtration is then carried out to obtain the filtered recovery paste.

3. The method of manufacturing a circuit board according to claim 1, wherein the fiber is a glass fiber, and an opening diameter of a filter to be used at the filtering step is equal to or larger than three times as large as an average particle diameter of a metal particle contained in the conductive paste and is equal to or smaller than twenty times as large as an average diameter of the fiber.

4. The method of manufacturing a circuit board according to claim 1, wherein the first prepreg differs from the second prepreg in at least one of thicknesses of the prepregs, the numbers of fibers constituting the prepregs and densities thereof.

* * * * *